(12) United States Patent
Miteva et al.

(10) Patent No.: US 7,929,200 B2
(45) Date of Patent: Apr. 19, 2011

(54) DEVICE FOR MODIFYING THE WAVELENGTH RANGE OF A SPECTRUM OF LIGHT

(75) Inventors: Tzenka Miteva, Stuttgart (DE);
Gabriele Nelles, Stuttgart (DE);
Stanislav Balouchev, Mainz (DE);
Vladimir Yakutkin, Mainz (DE)

(73) Assignee: Sony Corporation, Tokyo (JP)

( * ) Notice: Subject to any disclaimer, the term of this patent is extended or adjusted under 35 U.S.C. 154(b) by 150 days.

(21) Appl. No.: 12/314,122

(22) Filed: Dec. 4, 2008

(65) Prior Publication Data

US 2009/0290211 A1    Nov. 26, 2009

(30) Foreign Application Priority Data

Dec. 4, 2007    (EP) .................................... 07023496

(51) Int. Cl.
*G02F 1/35*    (2006.01)
(52) U.S. Cl. ........................................................ 359/326
(58) Field of Classification Search ........... 359/326–332
See application file for complete search history.

(56) References Cited

U.S. PATENT DOCUMENTS

| | | | |
|---|---|---|---|
| 5,539,100 A | | 7/1996 | Waisielewski et al. |
| 2005/0056815 A1* | | 3/2005 | Miteva et al. ............... 252/582 |
| 2005/0077817 A1 | | 4/2005 | Yamazaki et al. |
| 2005/0079385 A1 | | 4/2005 | Nomura et al. |
| 2009/0224659 A1* | | 9/2009 | Miteva et al. ............... 313/504 |

FOREIGN PATENT DOCUMENTS

| | | |
|---|---|---|
| AP | 1 484 379 A1 | 8/2004 |
| EP | 2067838 A1 * | 6/2009 |
| WO | 2006/008068 A1 | 1/2006 |

OTHER PUBLICATIONS

S. Baluschev et al., "Two pathways for photon upconversion in model organic compound systems," J. of Applied Physics, vol. 101, American Institute of Physics, 2007.
S. Baluschev et al., "Upconversion with ultrabroad excitation band: Simultaneous use of two senitizers," Applied Physics Letters, vol. 90, American Institute of Physics, 2007.
S. Baluschev et al., "Rsponse to Comment on 'Two pathways for photon upconversion in model organic compound systems' [J. Appl. Phys. 101, 023101 (2007)]," J. of Applied Physics, vol. 102, American Institute of Physics, PTO-1449.
U.S. Appl. No. 12/791,334, Jun. 1, 2010, Miteva, et al.
U.S. Appl. No. 12/791,237, Jun. 1, 2010, Miteva, et al.
U.S. Appl. No. 12/746,273, Jun. 4, 2010, Miteva, et al.

* cited by examiner

*Primary Examiner* — Daniel Petkovsek
(74) *Attorney, Agent, or Firm* — Oblon, Spivak, McClelland, Maier & Neustadt, L.L.P.

(57) ABSTRACT

The present invention relates to a device for modifying, e.g. narrowing the wavelength range of a spectrum of light.

64 Claims, 32 Drawing Sheets

1. Triclinic Symmetry
2. Multi-component system

1. Common matrix — PS low molecular weight
2. Down-Conversion: Perylene
3. Up-Conversion I: Perylene / PdOEP
4. Up-Conversion II: Perylene / PdTBP

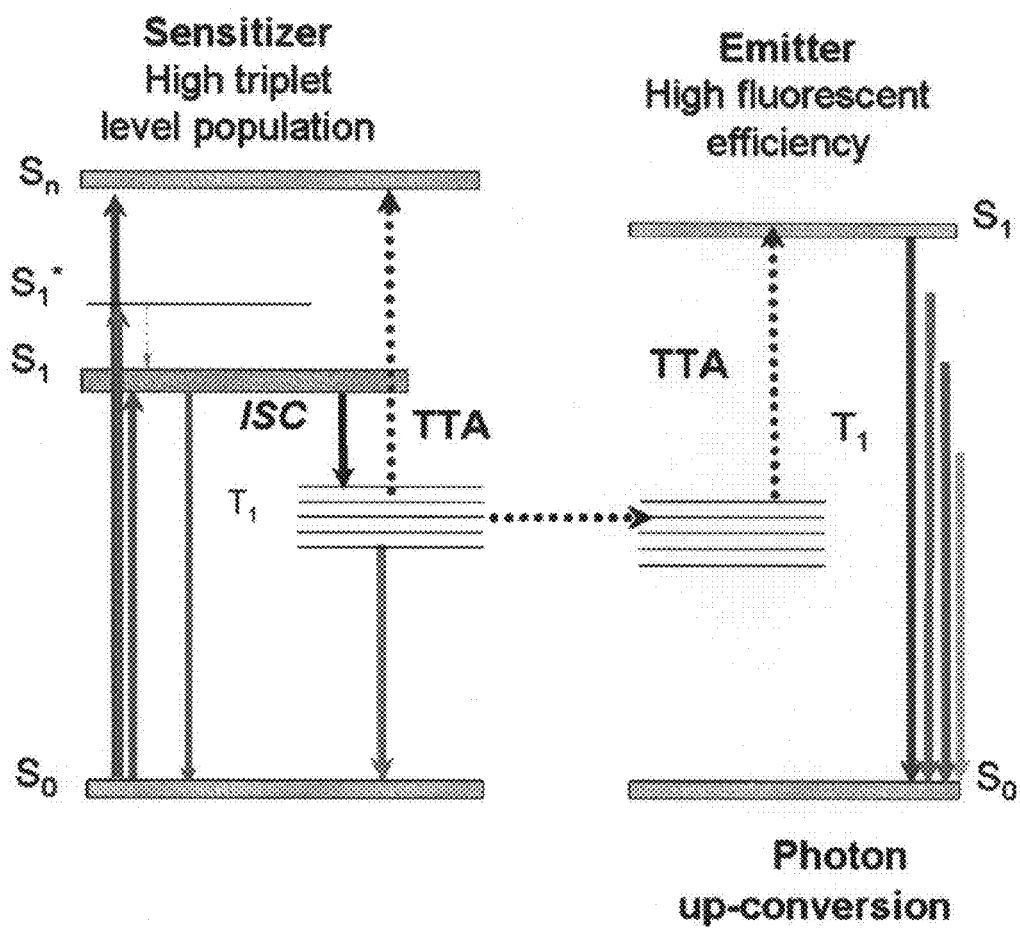
Figure 1: Energetic scheme of a TTA supported up-conversion process.

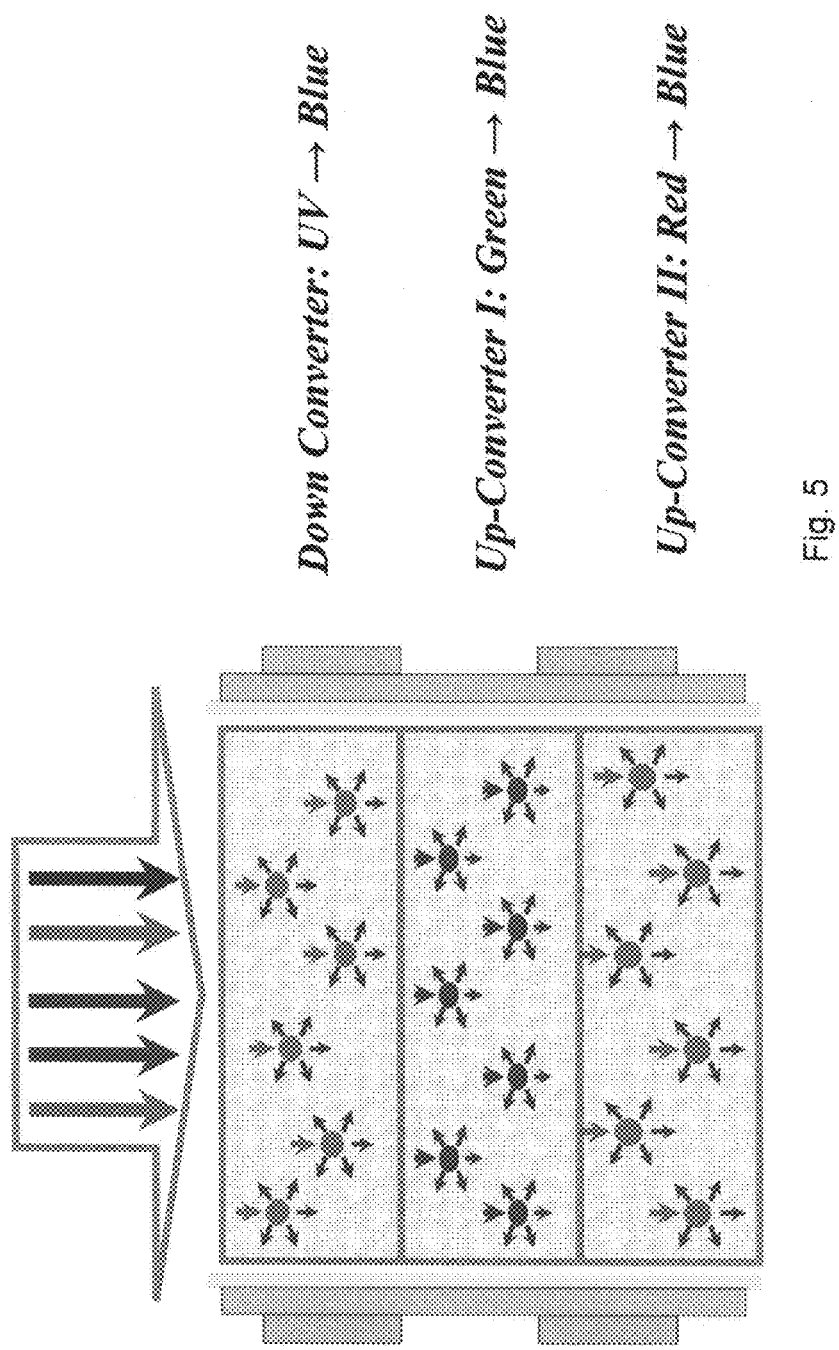

1. Triclinic Symmetry
2. Multi-component system

1. Common matrix – PS low molecular weight
2. Down-Conversion: Perylene
3. Up-Conversion I: Perylene / PdOEP
4. Up-Conversion II: Perylene / PdTBP 1. Planar waveguide with cutting (rejecting) wavelength: $\lambda_{cut} \leq \lambda_{emitter}^{red}$
2. Down-Conversion: Perylene
3. Up-Conversion I: Perylene / PdOEP
4. Up-Conversion II: Perylene / PdTBP

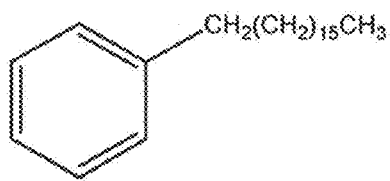 a)
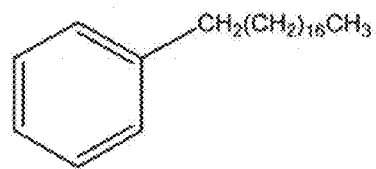 b)
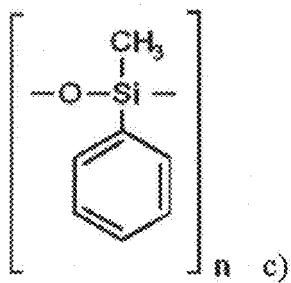 c)
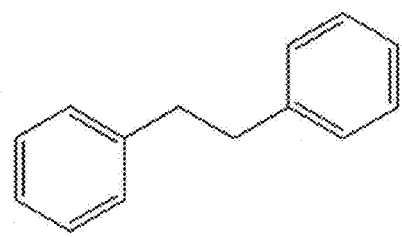 d)
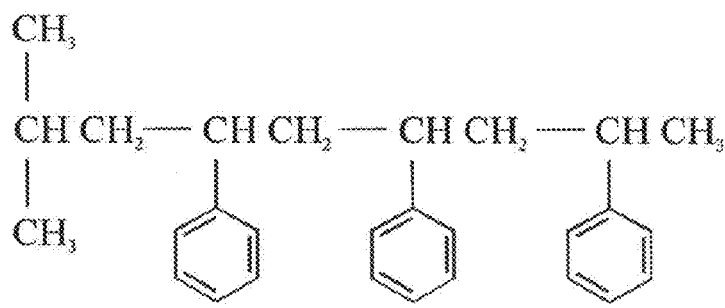 e)
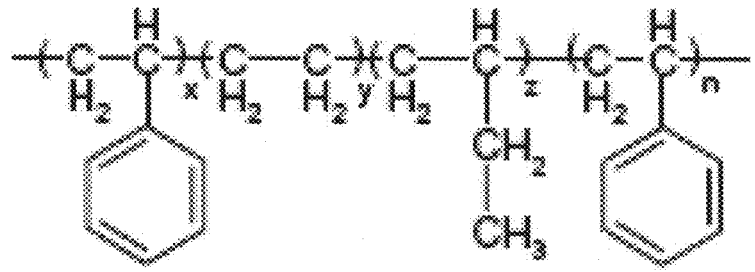
SEBS f)
Figure 15

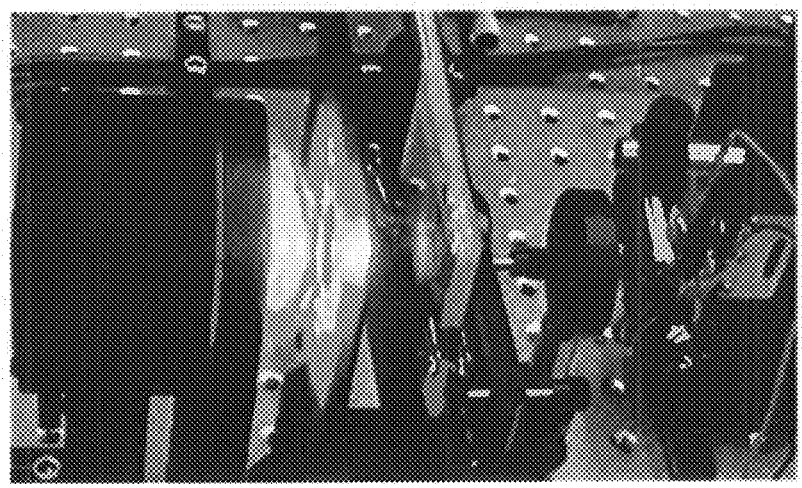
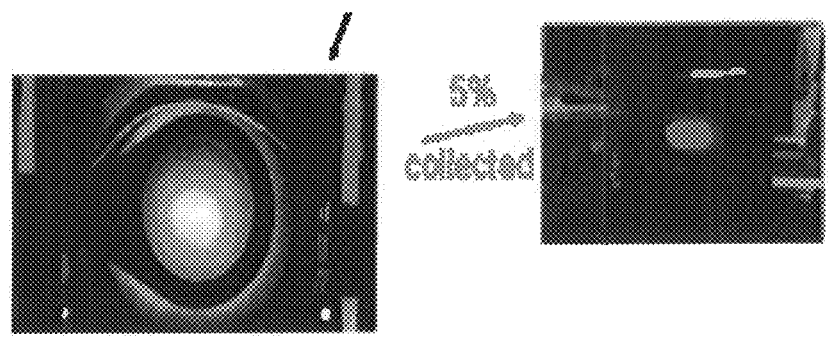
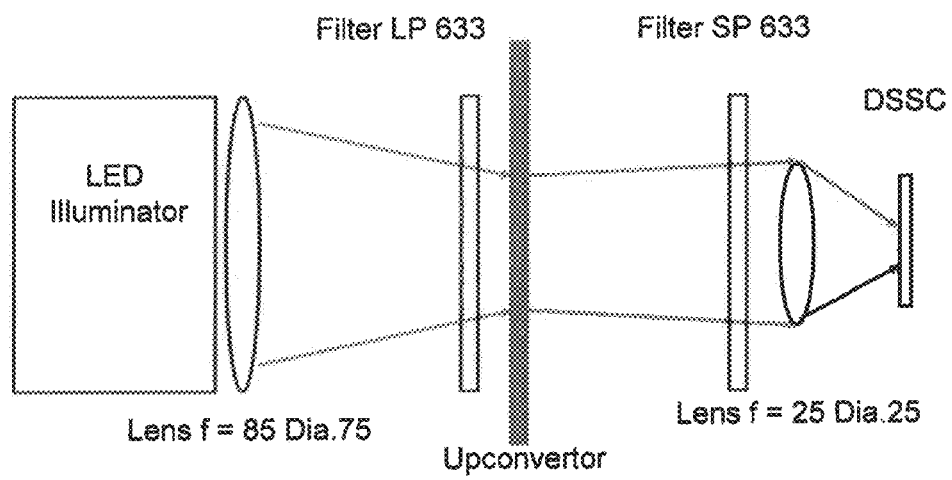
Figure 17

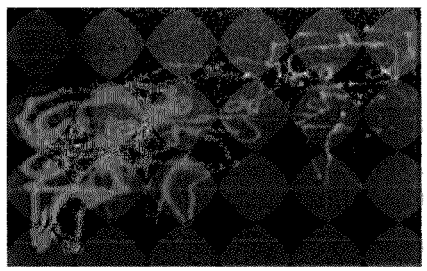
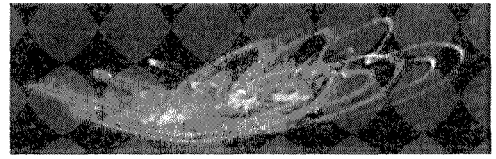
Figure 19 D)

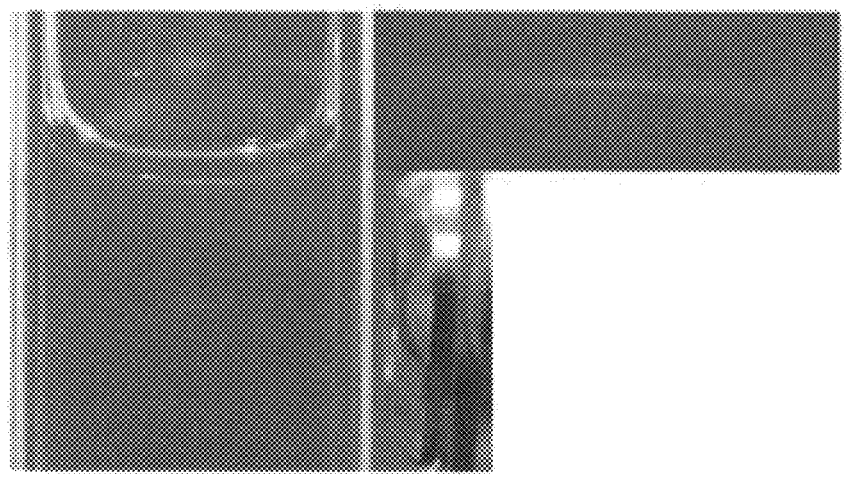
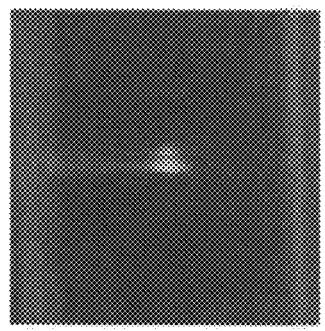
Figure 21

DEVICE FOR MODIFYING THE WAVELENGTH RANGE OF A SPECTRUM OF LIGHT

BACKGROUND OF THE INVENTION

This application claims the benefit of European Patent Application Serial No. 07 023 496.8, filed on Dec. 4, 2007 the entire contents of which are incorporated herein by reference The present invention relates to a device for modifying, e.g. narrowing, the wavelength range of a spectrum of light.

In a number of systems, it has been observed that irradiation by light with longer wavelength causes emission of a light with shorter wavelength. This phenomenon, which is also related to as "frequency up-conversion" or shortly "up-conversion" is most often associated with high light intensities available from pulsed lasers. It is presently believed that the up-conversion process involves the energy transfer of several lower excited states to a single higher excited state which is then capable of emitting light with a shorter wavelength, i.e. higher energy. This process has been described for a number of inorganic systems in the solid state, including crystals, thin films and nanoparticles. Usually the up-conversion process in the crystalline systems includes "sensitising" components, "activator" components and/or matrix (crystal) components. Typically the matrix is co-doped with rare earth ions, which act as "sensitisers" as well as "activators". One of the dopands absorbs in the low-wavelength region (typically infrared) whereupon the absorbed photon energies are then transferred to another dopand, the activator ions, which emit in the blue or green region (E. L. Falcao-Filho et al. J. Appl. Phys 92, 3065, (2002), Yoh Mita et al. Appl. Phys. Lett. 62, 802 (1992), Trash et al. Journal of OSA Bulletin 11, 881 (1994)). Furthermore crystalline nanoparticles have been described, a combination of which is dispersed in host matrices to form thin films. These crystalline nanoparticles also have been shown to be capable of energy up-conversion, which process takes place between the various species of nanoparticles and include an energy transfer step (e.g. U.S. Pat. No. 6,541,788) or the crystalline nanoparticles act as a matrix for other dopands such as $Eu^{3+}$-ions, $Tb^{3+}$ions, $Tb^{3+}$-ions, $Ce^{3+}$-ions etc., and these dopands upon irradiation of light are capable of increasing the fluorescence intensity and quantum efficiency of the nanoparticles.

These systems are of potential interest for the fabrication of lasing materials, photovoltaic devices and so on. Due to the nature of the components involved they are, however, rather expensive in manufacture and furthermore not particularly suited for the preparation of for example, films over large areas or the preparation on flexible substrates, both of which should be particularly useful for the fabrication of commercially useful photovoltaic devices, such as solar cells.

One approach to address this problem was to use organic compounds, instead of inorganic ones. These organic up-conversion systems are all based on direct two-photon or multi-photon excitation and/or the excitation of molecules populating high vibrational states into a first excited state, which latter process is also sometimes referred to as "hot band-absorption". In the direct, i.e. simultaneous two-photo excitation the up-conversion is a result of a direct two-photon pumping of dyes with large two-photon absorption (TPA) cross-section, which dyes are either in solution or in films (including so called "solid" solutions, with inert polymers as an inactive matrix, i.e. a solid "solvent"). This inactive matrix is inactive in the sense that it does not take part in the up-conversion process whatsoever. Various systems have been described, and there is an ongoing search for new organic dyes with greater TPA-cross-section and TPA-dyes which are bound to polymer molecules or doped in polymer matrices (U.S. Pat. No. 5,912,257, U.S. Pat. No. 6,555,682, U.S. Pat. No. 6,100,405, T. Kojei et al. Chem. Phys. Lett. 298, 1 (1998), G. S. He et al., Appl. Phys. Lett 68, 3549 (1996) R. Schroeder et al., J. Phys.: Condens. Matter 13, L313 (2001); R. Schroder et al., J. Chem. Phys. 116, 3449(2001)). Where TPA-dyes are doped in polymer matrices, again, the polymers are inactive compounds which do not take part in the up-conversion process.

Where the up-conversion is attributed to hot-band absorption, i.e. the excitation of molecules which populate high vibrational states, this has, in some cases been used for laser cooling of matter (J. L. Clark et al. Phys Rev. Lett 76, 2037 (1996)) and/or as a temperature probe of opto-electronic devices (J. M. Lupton, Appl. Phys. Lett 80, 186 (2002)).

Another area of research in the field of organic compounds is the field of "optical limiters". An optical limiting material shows non-linear absorption characteristics. This is due to the phenomenon that the cross-section of the excited state is large than that of the ground state. The larger the input energy the more molecules become excited into the state having a larger cross-section, thus resulting in an increasing absorption coefficient. Optical limiters based upon this nonlinear absorption on the picosecond and nanosecond time-scales have been reported for a number of materials, including metallophthalocyanins, porphyrins and fullerenes but also inorganic nanoparticles (Qureshi F M et al. Chem. Phys. 231, 87 (1998) and other references cited therein; Sun et al. Int. Rev. Phys. Chem. 18(1) 43 (1999) and references cited therein; W. Su, T. M. Cooper; Chem. Mater. 10, 1212 (1998); J. W. Perry et al., Science 273, 1533 (1996); K. A. Nguen et al., J. Chem. Phys. 118, 5802 (2003).

In a number of bimolecular or multimolecular systems comprising at least one sensitizer component and at least one emitter component, photon energy up-conversion has been shown to occur based on triplet-triplet annihilation processes (Baluschev et al., Angew. Chem. Int. Ed., 2007, 46, 1-5). Such photon energy up-conversion is believed to be an inherently connected chain of three steps. The first step is inter system crossing (ISC) at the sensitizer molecules followed by the second step, namely the transfer of the excitation of the sensitizer triplet to the emitter triplet (triplet-triplet transfer, TTT). The third step is a subsequent triplet-triplet annihilation (TTA) mostly between emitter molecule triplets. An efficient triplet-triplet annihilation assisted photon energy up-conversion has been observed for a broad variety of metal complexes acting as sensitizers, and different emitter molecules. The main advantage of such triplet-triplet annihilation based photon energy up-conversion processes is their independence of coherent excitation light. Furthermore such triplet-triplet annihilation assisted photon energy up-conversion only requires excitation light having low intensity (as low as 100 mW cm-2) and low spectral power density (as low as 125 μW nm-1) [Baluschev et al., APL, 90, 181103, 2007]. These studies based on triplet-triplet annihilation assisted photon energy up-conversion have been performed in solution.

None of the aforementioned organic systems, however, have proved to be particularly versatile due to the inherent characteristics of the up-converting material present in the corresponding system or due to the delicate nature of the entire set-up which made their use in practical applications and devices virtually impossible. Furthermore in some cases, especially the systems based on inorganic components, up-conversion could only be induced under conditions of very low temperatures, −180° C. and below. Also, none of the optical limiting materials has been reported to show up-converting behaviour when this material is on its own. The inorganic based systems work only with high intensity monochromatic laser light, normally in the order of kW/cm2 and they require very high spectral power density of the excitation light source, typically in order of Wnm-1, additionally, they have low efficiencies which have so far only been reported for crystalline powders as ca. 1% to a maximum of 4% but these are only when for high intensities (Page et al., 1998, J. Opt. Soc. Am. B, Vol. 15, No. 3, 996). Furthermore the systems reported so far only have emission characteristics which are intrinsic to the used corresponding materials, without any possibility to influence the ratio of emitted wavelengths.

The inorganic systems are based on crystalline materials and in order to be used in applications nanocrystals have to be specially prepared which would then be applied in a film, or, alternatively, the crystals would be ground into a fine powder and then distributed in a film, which, in turn causes problems with the even distribution of the crystalline powder within the film.

The process of photon harvesting plays an important role in many applications. For example the crop output of greenhouses very much depends on the amount and quality of light that effectively reaches the plants within the greenhouse. In solar cells, in particular organic solar cells, an important feature thereof is the limited spectral range of absorption in organic dye molecules. The most efficient solar cells presently harvest mainly the blue, green and yellow parts of the solar spectrum; hence, an important step would be the availability of organic materials absorbing further into the red and infrared parts of the spectrum. However, these most often have an absorption which is weak in the blue and green parts of the spectrum. There have been attempts to enhance solar cell efficiency by using down-shifting spectral converters whereby a layer of organic dye molecules was applied onto a solar cell, which organic dye molecules absorb incident light and reemit this at a red-shifted wavelength. These layers of spectral converters were also referred to as luminescence concentrators (van Sark et al., 2005, Solar Energy Materials and Solar Cells 87, 395-499). However, none of the attempts to enhance solar cell have been particularly successful (Trupke et al., 2006, Solar Energy Materials & Solar Cells 90, 3327-3338).

Accordingly it has been an object of the present invention to provide for a device to be used for modifying, e.g. narrowing the wavelength range of a spectrum of light incident on said device, wherein the device shows a great versatility with respect to the radiation wavelengths involved, both incident and emitted and which may therefore be tailor-made depending on the desired excitation and/or emission characteristics. Furthermore it has been an object of the present invention to provide a device which is suitable for film-formation over large areas, thereby enabling the production of tailor-made opto-electronic devices. It has also been an object of the present invention to provide for a device that allows to make efficient use of low intensity and/or low spectral power density light sources, such as the Sun, LED (broadband, non-coherent) and others and which may therefore be efficiently used as a spectrum concentrator.

All these objects are solved by a device for modifying, e.g. narrowing the wavelength range of a spectrum of light incident on said device, such that light emitted from said device has a modified, e.g. more narrow wavelength range in comparison to said incident light, said device comprising a medium for photon energy up-conversion comprising at least two components and a matrix in which said at least two components are distributed, wherein a first component is capable of absorbing light at a first wavelength region $w \leq \lambda1 \leq x$, which first component acts as a sensitizer in said medium, and wherein a second component is capable of emitting light at a second wavelength region $y \leq \lambda2 \leq z$, which second component acts as an emissive component in said medium, wherein $\lambda2 \leq \lambda1$, and wherein, upon absorption of light by said first component at said first wavelength region $\lambda1$, said emissive component emits light at said second wavelength region $\lambda2$, and wherein said first component and said second component are organic compounds, wherein said first component and said second component are distributed in said matrix which matrix is a solid, a gel or a fluid with viscosity equal or higher than $0.59 \times 10-3$ Pa·s, wherein said medium optionally comprises further pairs of sensitizer and emissive components, as defined above, but having different absorption and, optionally, emission wavelength regions, said device optionally further comprising a light transparent container for containing said medium, or optionally comprising a light transparent substrate for carrying said medium.

In one embodiment said medium comprises at least two pairs of sensitizer and emissive components, respectively, as defined in claim 1, each pair having a defined absorption wavelength region and a defined emission wavelength region, and said pairs of sensitizer and emissive components, respectively, differ from each other in at least their respective absorption wavelength region.

In one embodiment said medium additionally comprises a further component for photon energy down-shifting or photon energy down-conversion, said down-shifting or down-conversion component also being distributed within said matrix, said down-shifting or down-conversion component being capable of absorbing light of a defined wavelength region and emitting light at a wavelength region longer than said defined wavelength region.

In one embodiment said medium is arranged in a single layer or waveguide or shape suitable to cover parts or all of a surface of an object, upon which said light is incident, e.g. a solar cell, wherein, preferably, said single layer or waveguide or shape has cylindrical or paralleliped or triclinic symmetry.

In one embodiment said medium is arranged in several layers each layer having a different pair of sensitizer and emissive components in it, wherein, preferably, one layer of said several layers comprises said further component for photon energy down-shifting or down-conversion as defined in claim 3.

More preferably, said layer that comprises said further component for photon energy down-shifting or down-conversion is devoid of any pair of sensitizer and emissive component.

In one embodiment said medium comprises one pair of sensitizer and emissive component which absorbs in the green wavelength region and emits in the blue wavelength region and said medium comprises another pair of sensitizer and emissive component which absorbs in the red wavelength region and emits in the blue wavelength region.

In one embodiment said further component for photon energy down-shifting or down-conversion absorbs light in the UV-wavelength region and emits light in the blue wavelength region.

In one embodiment said medium comprises one pair of sensitizer and emissive component which is perylene and palladium octaethylporphyrine (PdOEP) and another pair of sensitizer and emissive component which is perylene and platinum octaethylporphyrine (PtOEP).

In one embodiment said medium comprises perylene as a component for photon energy down-conversion.

In one embodiment said matrix is transparent in the range from 300 to 1600 nm.

In one embodiment said fluid has a viscosity in the range of from $0.59 \times 10^{-3}$ to $1 \times 10^{6}$ Pa·s.

In another embodiment said matrix is a solid with elastic, plastic, viscoelastic or viscoplastic properties.

In one embodiment said matrix is an organic or inorganic glass with a viscosity $1 \times 10^{3}$ to $1 \times 10^{17}$ Pa·s.

In another embodiment said matrix is a viscous liquid having a viscosity $\geq 0.59 \times 10^{-3}$ Pa·s, wherein, preferably, said matrix is made of one or several materials selected from the following organic oligomers, said oligomers having a finite number of monomeric units, and co-oligomers, said co-oligomers being comprised of a mixture of monomeric units, said momomeric units including, but not being limited to the class of substituted or non-substituted styrenes, phenylenes, phenylene diamines, phenylene diols, methyl methacrylates, phenols, acrylic acids, vinyls, such as vinyl alcohol or vinyl chloride, lactic acids, carbohydrates, carbonates, imides, amides, such as acryl amide, olefins, such as ethylene and propylene, olefin oxides, such as ethylene oxide or propylene oxide, olefin glycols, such as ethylene glycol and propylene glycol, terephthalic acids, epsilon-caprolactams, urethanes, silanes, siloxanes and substituted and functionalised forms of any of the foregoing, and any combination thereof, said matrix optionally and additionally including one or several organic solvents or water to vary, adjust and control the viscosity of said medium.

In one embodiment said matrix is an inorganic or organic gel having a viscosity $\geq 1 \times 10^{-1}$ Pa·s, wherein, preferably, said organic gel is an organic physical gel having non-covalent bonds or is a chemical gel having covalent bonds and preferably being crosslinked wherein crosslinking is achieved by irradiation or by addition of crosslinking chemicals or both.

In one embodiment said gel contains one or several linear and branched polymers, including, but not limited to poly(styrenes), (poly)phenylenes, poly(naphthalate), poly(terephthalate), poly(olefin-naphthalate) and poly(olefin-terephthalate), such as poly(ethylene naphthalate), poly(ethylene terephthale), poly(ether imides), poly(ether ketones), poly(hydroxyl-butyrates), poly(phenylene diamines), poly(phenylene diols), poly(methyl methacrylates), poly(phenols), poly(acrylic acids), poly(vinyls), such as poly(vinyl alcohols) or poly(vinyl chlorides), poly(lactic acids), poly(carbohydrates), poly(carbonate), poly(imide), poly(amide), such as poly(acryl amide), olefins, such as poly(ethylene) and poly(propylene), poly(olefin oxides), such as poly(ethylene oxide) or poly(propylene oxide), poly(olefin glycols), such as poly(ethylene glycol) and poly(propylene glycol), poly(terephthalic acids), poly(epsilon-caprolactam), poly(urethanes), polysilanes, poly(siloxanes) and combinations, mixtures or blends of any of the foregoing, said matrix optionally and additionally including one or several organic solvents or water to vary, adjust and control the viscosity of said medium.

In one embodiment said matrix is a solid or glass having a viscosity $\geq 1 \times 10^{3}$ Pa·s, wherein, preferably, said matrix is made of a thermoplastic polymer or copolymer ((block, alternating and/or graft copolymers) or a mixture thereof and/or with one or several suitable solvents to control and adjust viscoelasticity or plastoelasticity of said medium.

In one embodiment said matrix is made of polymer or copolymer, including block, alternating and/or graft copolymers with molecular weights from $10^{3}$ to ca. $10^{9}$, including but not limited to poly(styrenes), (poly)phenylenes, poly(naphthalate), poly(terephthalate), poly(olefin-naphthalate) and poly(olefin-terephthalate), such as poly(ethylene naphthalate), poly(ethylene terephthale), poly(ether imides), poly(ether ketones), poly(hydroxyl-butyrates), poly(phenylene diamines), poly(phenylene diols), poly(methyl methacrylates), poly(phenols), poly(acrylic acids), poly(vinyls), such as poly(vinyl alcohols) or poly(vinyl chlorides), poly(lactic acids), poly(carbohydrates), poly(carbonate), poly(imide), poly(amide), such as poly(acryl amide), olefins, such as poly(ethylene) and poly(propylene), poly(olefin oxides), such as poly(ethylene oxide) or poly(propylene oxide), poly(olefin glycols), such as poly(ethylene glycol) and poly(propylene glycol), poly(terephthalic acids), poly(epsilon-caprolactam), poly(urethanes), poly(silanes), poly(siloxanes) and combinations, mixtures or blends of any of the foregoing, said matrix optionally and additionally including one or several organic solvents or water to vary, adjust and control the viscosity of said medium.

In one embodiment said matrix is made of a thermosetting plastic, wherein, preferably, said thermosetting plastic is selected from polyester resins, epoxy resins, preferably two-component epoxy resins, acrylics, polyimides, melamine resins, and phenol-formaldehyde resins.

In one embodiment said matrix is made of an elastic solid and more specifically a polymer elastomer, wherein, preferably, said matrix is made of an elastic solid and more specifically a polymer elastomer selected from polyacrylic rubbers, silicone rubbers, fluorosilicone rubbers, fluoroelastomers, perfluoroelastomers, polyether-block-amides, and olefin rubbers.

In one embodiment said matrix does not take part in a photon energy up-conversion process upon irradiation of said medium.

In one embodiment said first component is a first organic compound and said second component is a second organic compound.

In one embodiment said first component is neither covalently bonded nor complexed to said second component.

In one embodiment said first component is covalently bonded or complexed to said second component.

In one embodiment said first and said second organic compounds are different compounds.

In one embodiment said first and said second organic compound is a carbon-containing compound, with the proviso that it is not a hydrogen-free chalcogenide of carbon, a derivative thereof, a salt-like carbide, a metallic carbide or a metal-carbonyl.

In one embodiment said emissive component's emitting light at said second wavelength region $\lambda 2$ is due to an up-conversion process based on direct or sequential two-photon excitation or on direct or sequential multi-photon excitation or on excitation of molecules populating high vibrational state(s) ("hot-band absorption"), which up-conversion process occurs upon absorption of light by said first component at said first wavelength region $\lambda 1$.

In one embodiment said emissive component's emitting light at said second wavelength region $\lambda 2$ is due to an up-conversion process based on a triplet-triplet annihilation process between photoexcited molecules of said emissive component and/or based on a triplet-triplet annihilation process between photo-excited molecules of said first component.

In one embodiment said second wavelength region $\lambda 2$ is in the range 360-750 nm and said first wavelength region $\lambda 1$ is in the range 450-1600 nm.

In one embodiment said first component is an organic dye or molecule having a populated triplet or mixed triplet-singlet state, a two-photon-absorbing (TPA)-dye, an optical limiting compound, another molecule with a populated triplet state or an optical limiting compound—e.g. a fullerene, or carbon nanotubes.

In one embodiment said second component is an organic dye.

In one embodiment said first component is a first organic dye and said second component is a second organic dye, wherein said first and second organic dyes are the same or different, wherein, preferably, said first and/or said second organic dye is selected from the group comprising organic dyes with populated triplet states or capable of direct and/or sequential two-photon excitation, organic dyes capable of direct and/or multi-photon excitation, organic dyes capable of non-linear absorption and organic dyes capable of hot-band absorption.

In one embodiment said organic dye, in particular said first organic dye, is selected from the group comprising organic molecules having populated triplet states and especially metal-organic complexes having populated triplet states, for example but not limited to Li, Mg, Al, Ti, V(VO), Mn, Fe, Co, Ni, Cu, Zn, Ga, Ru, Pd, Ag, Re, Os, Ir, Pt, Pb, U (UO2) containing organic complexes, or any combination of the foregoing to ensure wavelength control, wherein, preferably, said first organic dye is selected from the group comprising compounds with a populated triplet state, including but not limited to porphyrins, including extended porphyrins, texaphyrins, sapphyrins, orangerins, any carbon-bridged pyrrolic system, substituted porphyrins and any of the foregoing containing metals including but not limited to Li, Mg, Al, Ti, V(VO), Mn, Fe, Co, Ni, Cu, Zn, Ga, Ru, Pd, Ag, Re, Os, Ir, Pt, Pb, U(UO$_2$), phtalocyanines, including extended phtalocyanines, substituted phtalocyanines, and any of the foregoing phtalocyanins containing metals including but not limited to Li, Mg, Al, Ti, V(VO), Mn, Fe, Co, Ni, Cu, Zn, Ga, Ru, Pd, Ag, Re, Os, Ir, Pt, Pb, U(UO$_2$), benzopyridines, benzopyrizines, quinolates and hydroxyquinolates, acetyl-acetonates, substituted benzopyridines, benzopyrizines, quinolates and hydroxyquinolates, acetyl-acetonates;

mixtures of any of the foregoing, and said second organic dye is selected from the group comprising compounds showing fluorescence emission in the range of from 360 to 750 nm, in particular fluorescent dyes showing fluorescence emission in the range of from 360 nm to 750 nm, e.g.

anthracenes, tetracenes, pentacenes, perylenes substituted anthracenes, tetracenes, pentacenes, perylenes phenyl (bi-, tri-phenyl)-bridged anthracenes, tetracenes, pentacenes, perylenes fluorenes, thiophenes, polyfluorenes and oligofluorenes, with or without any sidechain pattern and their copolymers, polyparaphenylenes, including polyparaphenylene vinylene, and polyphenyleneethinylenes.

In one embodiment said first and said second organic dye are chosen such that a populated triplet state of said first organic dye is at an energy level allowing a triplet-triplet annihilation process and the subsequent transfer of energy to an excited singlet state of said second dye.

In one embodiment combinations of said first and second component are selected from:
a) Green couple: DPA/PdOEP;
(i.e. 9,10-diphenylanthracene (DPA)/2,7,8,12,13,17,18-octaethylporphyrin Palladium (PdOEP))
b) Red couple: BPEA/PdTPTBP; (i.e. 9,10-Bis(phenylethynyl)anthracene (BPEA)/meso-Tetraphenyl-tetrabenzoporphyrin Palladium (PdTPTBP))
c) Near infra red couple: BPEN/PdTPTNP; (i.e. 9,10-Bis(phenylethynyl)naphthacene (BPEN)/meso-Tetraphenyl-octamethoxide-tetranaphtho[2,3]porphyrin Palladium (PdTPTNP))
d) Direct Red-to-Blue couple: Perylene/PdTPTBP; (i.e. Dibenz[de,kl]anthracene (Perylene)/meso-Tetraphenyl-tetrabenzoporphyrin Palladium (PdTPTBP))
e) Direct Infrared-to-Green couple: BPBT/PdTPTNP; (i.e. 4,4'-bis(5-tetracenyl)-1,1-biphenylene (BPBT)/meso-Tetraphenyl-octamethoxide-tetranaphtho[2,3]porphyrin Palladium (PdTPTNP))
f) Infrared-to-yellow couple: Rubrene/PdTAP; (i.e. 5,6,11,12-Tetraphenylnaphthacene (Rubrene)/Tetraantraporphyrin Palladium (PdTAP)).

In one embodiment said first and said second components are homogeneously distributed within said matrix.

In one embodiment said first and said second components are encapsulated in particles having average dimensions in the range of from 5 nm to 999 µm, and such particles are homogeneously distributed within said matrix, wherein, preferably, said particles have average dimensions in the range of from 10 nm to 999 µm.

In one embodiment said particles have a surface which is functionalized by functional groups to allow distribution of said particles within said matrix, said functional groups preferably being H, —(CH$_2$)$_n$CH$_3$, —(CH$_2$)$_n$—COOR, —(CH$_2$)$_n$—OR, —(CH$_2$)$_n$—SR, —(CH$_2$)$_n$—NR$_2$, —((CH$_2$)$_p$—O)$_n$—CH$_3$, with R=H, substituted or non-substituted alkenyl or alkynyl, or halogen, such as Cl, Br, F, I, or NO$_2$, NH$_2$, CN, SO$_3$H, OH.

The objects of the present invention are also solved by the use of the device according to the present invention for modifying, e.g. narrowing the wavelength range of a spectrum of light incident on said device, such that light emitted from said device onto an object has a modified, e.g. more narrow wavelength range in comparison to said incident light, said use comprising the steps:

arranging said device in such a spatial relation to said object such that radiation irradiated upon said object passes through said device before impinging on said object, and, optionally, irradiating said object, e.g. a solar cell or a window or a window of a greenhouse with light, preferably sunlight.

Preferably, said step of arranging involves contacting said device with said object, or using said device as cover of said object.

The present inventors have surprisingly found that it is possible to use organic systems for photon energy up-conversion as a means for modifying, e.g. narrowing the wavelength range of a spectrum of light, e.g. for enhancing photon harvesting in an object, e.g. in a solar cell, or for the more efficient use of the solar spectrum in a greenhouse. Because the organic photon energy up-conversion systems according to the present invention may be formulated in such a manner that they can be deposited in layers over large areas and may also be used in combination with flexible substrates, these can act as efficient spectrum concentrators. As used herein, the term "spectrum concentrator" is meant to refer to a device for modifying, e.g. narrowing the wavelength range of a spectrum of light incident on said device, such that light emitted from said device has a modified, e.g. more narrow wavelength range in comparison to said incident light. Preferably, for such modifying, e.g. narrowing, a process of photon energy up-conversion alone or in combination with photon energy down-shifting or with down-conversion is used. For example using photon energy up-conversion alone or in combination with photon energy down-shifting, a broad spectrum of light that is irradiated upon said device, is modified, e.g. narrowed and thus effectively "concentrated" into a more narrow region which itself may lie in the original incident spectrum or may lie outside thereof. As an example, the solar spectrum may be effectively narrowed into its visible wavelength region (VIS region) having a more narrow range than the total solar spectrum by photon energy up-conversion from the infrared region to the visible region alone or in combination with a red-shifting (by down-shifting or down-conversion) of the UV-region into the visible region. Furthermore, also within the visible region itself a narrowing can be achieved, for example by up-conversion from the red into green region and by down-shifting of the blue into the green region. Using such a spectrum concentrator device based on photon energy up-conversion alone or in combination with photon energy down-shifting or in combination with down-conversion in accordance with the present invention, the photon harvesting of a solar cell, the use of photons from different ranges in a greenhouse or another suitable object and thereby its respective efficiency may be improved. The same concept may also be employed for windows of houses and vehicles, for example cars, where one might wish to concentrate certain parts of the incident solar spectrum inside of these objects, for example more red, more green radiation etc. This allows for example an enhancement of illumination by up-converting near infrared radiation into the visible wavelength range and down-conversion the UV-radiation into the visible wavelength range.

The term "modifying the wavelength range", as used herein is meant to refer to a process whereby the wavelength range of a spectrum of light irradiated upon an object is narrowed, i.e. made less broad, or at least shifted with respect to its original position. A "modified wavelength range" is a narrowed wavelength range or a wavelength range that is shifted with respect to its original position. Such narrowed or shifted wavelength range may be within the original wavelength range completely or partly, or may also be entirely outside of said original wavelength range. The term "device for modifying the wavelength range of a spectrum of light incident on said device", as used herein is therefore used synonymously with "spectrum concentrator" or "spectrum concentrator device". It should be noted that such modification is detectable in the light that is emitted from said device. Hence, effectively, the wavelength range of the emitted light is modified with respect to the incident light that is absorbed by said device.

Preferably, the photon energy up-conversion media in accordance with the present invention are contained within a container or carried by a substrate, thus enabling the use of a device in accordance with the present invention in combination with electro-optical devices, such as solar cells, or in combination with windows or as a window itself.

The term "light" as used herein, is meant to refer to electromagnetic radiation in the wavelength range of from 300-1600 nm, and any subset thereof.

The term "photon energy down-conversion", as used herein with respect to a component is meant to describe a scenario, wherein said component absorbs light at a shorter wavelength and emits light at twice longer wavelength, thereby effectively down-converting the energy of the absorbed light.

The term "photon energy down-shifting", as used herein with respect to a component is meant to describe a scenario, wherein said component absorbs light at a shorter wavelength and emits light at a longer wavelength, thereby effectively down-shifting the energy of the absorbed light.

With respect to possible geometries of the spectrum concentrators in accordance with the present invention, a large variety is possible, such as a single layer comprising one or several pairs of sensitizer/emissive components and, optionally also down-converting or down-shifting components. Alternatively, the various sensitizer/emissive component pairs may be distributed in separate layers with the device having a multi-layer structure. Each of the layers have an average thickness in the range of from 10 μm to 300 μm, preferably 50 μm to 250 μm, and more preferably 100 μm to 200 μm. The system formed by such a single layer of multi-layer structure may have cylindrical symmetry or triclinic symmetry, or the medium in accordance with the present invention may alternatively also be enclosed within a planar waveguide having a defined cutting wavelength (λ cut) corresponding to the emission spectrum of the emitter molecules of the given sensitizer/emitter couple (UC couple=up-converter couple, i.e. the up-converted spectrum). The up-converted spectrum will be transmitted through the waveguide walls and absorbed from the solar cell, but the longer wavelengths, i.e. prior to up-conversion, will not be transmitted and will propagate into the planar waveguide until they have been absorbed und subsequently up-converted.

$$\lambda_{UV}^{pump} \leq \lambda_{cut} \leq \lambda_{red}^{UC\ couple} \& \lambda_{green}^{UC\ couple}$$

(The subscripts above refer to the spectral region; UC couple=up-conversion couple or pair of sensitizer/emissive component.)

All of the organic systems for photon energy up-conversion of the prior art reported above are based on a solution matrix, i.e. a matrix where the active components are present within a solvent. Hence their application in devices is difficult and requires sealed compartments. The present inventors have managed to devise media for photon energy up-conversion which are based on organic sensitizers and emitters which comprise a matrix that allows the deposition of such media as a film over extended areas without the need to seal the compartment in which the sensitizer and emitter are located or to undertake any measures to avoid leakage of solvents. Furthermore the media according to the present invention allow to form three dimensional shapes thereof, which may then for example be used as displays or windows or objects which convert light of a longer wavelength into light of a shorter wavelength. The present inventors have surprisingly found that if one embeds and distributes organic sensitizer compounds and organic emitter compounds in a matrix which matrix is a solid, a gel or a fluid with viscosity equal or higher than $0.59 \times 10^{-3}$ Pa·s, preferably $>1.0 \times 10^{-3}$ Pa·s, even more preferably $>3.0 \times 10^{-3}$ Pa·s, the medium comprising such matrix, sensitizer and emitter is well suited to be used in a number of applications, including large area displays or windows. This is because the solid, gel or highly viscous matrix allows the medium to retain its shape once it has been brought into a desired form, such as a sheet. The term "highly viscous", as used herein is meant to refer to a viscosity of $\geq 0.59 \times 10^{-3}$ Pa·s., preferably $>1.0 \times 10^{-3}$ Pa·s, even more preferably $>3.0 \times 10^{-3}$ Pa·s. The value of $\geq 0.59 \times 10^{-3}$ Pa·s is the viscosity of toluene at room temperature under ambient conditions. The viscosity of the matrix in accordance with the present invention should be at least equal to such value, as any value below would inevitably lead to the same problems that are associated with the prior art (lack of form stability, leakage, no large area devices possible etc.).

The media of the present invention work with non-coherent sun-light with intensities as low 10 mW/cm² and have higher efficiencies, i.e. around 5-6%, even when working with solar light as excitation source having a spectral density as low as 50 µW nm$^{-1}$. The mean spectral power density of the visible solar irradiation is 85 µWnm$^{-1}$, therefore in the present invention it is possible to use sun-light without any external focusing. For example, in the system using rubrene as emissive component and PdTPTBP+PdTPTNP+PdTAPas sensitizers the necessary intensity is 10 mW with width of the excitation spectrum of 200 nm (from □=620 nm up to □=820 nm), the corresponding spectral power density is 50 µW nm$^{-\lambda}$. (5,6,11,12-Tetraphenylnaphthacene (Rubrene) meso-Tetraphenyl-tetrabenzoporphyrin Palladium (PdTPTBP) meso-Tetraphenyl-octamethoxide-tetranaphtho[2,3]porphyrin Palladium (PdTPTNP) Tetraanthraporphyrin Palladium (PdTAP).

Moreover, the quantum efficiency of the up-conversion process in accordance with the present invention does not depend on the coherent properties of the excitation light: Excitation photons may be used for photon energy up-conversion in accordance with the present invention, which excitation photons may have a with a time mismatch around 40 µs, depending on the life time of the excited emitter triplet states. Moreover the excitation photons may be from an excitation energy region more than 0.3 eV broad, depending on the width of the sensitizer absorption spectrum, and the excitation photons may have a spatial separation more than 20 µm depending on the specific diffusion coefficients of the sensitizer and emitter molecules. This allows that the media according to the present invention may be used as spectrum concentrators.

Furthermore there are no requirements for the wave front of the excitation light, as the photons may have random orientation in space until they hit the up-convertor surface. Moreover the components within the media of the present invention are highly versatile in the sense that one may not only influence the active components, i.e. the components taking part in the photon energy up-conversion process, which allows control over the spectral properties of the medium, but also the composition of the matrix to ensure controlled morphology of the medium and the film or object formed thereof.

By the present invention a greater versatility is achieved in that the possibility to combine the properties of at least two independently active compounds, a new system/composition is created having a variety of properties which are not shown by each component, when on its own. For example, the absorbing molecules, i.e. "sensitiser" molecules can be varied, whereby the lower energy wavelengths to be up-converted can be varied. Alternatively or in addition thereto, the emissive molecule can be varied thereby allowing a variation of the higher energy wavelengths of the up-converted emission. In using at least one organic compound, either as sensitizer or as emitter, or by using organic compounds for both, it is also possible to make use of the good film-forming properties of organic compounds thereby making the compositions according to the present invention particularly amenable for large-area opto-electronic devices.

The term "transparent in the range of from x nm to y nm", as used herein is meant to refer to transparency over the entire range or only a subset thereof.

The term "elastic" when used herein in connection with the matrix is meant to refer to a matrix which, upon deformation e.g. by the exertion of pressure or stress, returns to its original state which it had prior to said deformation, once such pressure or stress is released.

The term "plastic" when used herein in connection with the matrix is meant to refer to a matrix which undergoes a non-reversible change of shape in response to an applied force.

The term "viscoelastic" as used herein, is a time-dependent property in which a material under stress produces both a viscous and an elastic response. A viscoelastic material will exhibit viscous flow under constant stress, but a portion of mechanical energy is conserved and recovered after stress is released. Often associated with polymer solutions, melts and structured suspensions, viscoelastic properties are usually measured as responses to an instantaneously applied or removed constant stress or strain or a dynamic stress or strain. The term "viscoplastic", as used herein is a property in which a material behaves like a solid below some critical stress value, the yield stress, but flows like a viscous liquid when this stress is exceeded. Often associated with highly aggregated suspensions and polymer gels.

A "thermoplastic polymer" as used herein is a polymer which shows plastic behaviour in dependence on the temperature, i.e. it melts when heated and solidifies when cooled.

A "thermosetting plastic" as used herein is meant to refer to a plastic material, e.g. a polymer that cures into a stronger form through the application of energy, e.g. heat. Usually such curing process results in the formation of crosslinking bonds between the molecules of the plastic material, e.g. the polymer chains.

The term "viscosity", as used herein, is meant to refer to a material's tendency to resist flow.

A "two-component epoxy resin" as used herein is meant to refer to an epoxy resin which is only formed if two precursor components are added together. More specifically, such an epoxy resin is a thermosetting epoxide polymer that cures when mixed with a catalysing agent or "hardener". Examples for such a "two-component epoxy resin" are bisphenol A and epichlorohydrin.

The term "viscous liquid" as used herein is meant to refer to a liquid having a viscosity $\geq 0.59 \times 10^{-3}$ Pa·s. The person skilled in the art knows how to measure viscosity of liquids, and there are viscometers commercially available. In some embodiments shown further below, the present inventors used approximately $(20 \text{ to } 1000) \times 10^{-3}$ Pa·s. as a viscosity value for the matrix. However, the way of measuring such viscosity should be less significant, as all of the known viscometers give the same results within boundaries of 10%. As used herein the term "gel" usually refers to a system wherein one (or several) component(s) (also termed as "network component(s)") is(are) dispersed as a colloid in another component, such as a solvent. Preferably, a "gel" is a colloidal system with a finite, usually rather small yield stress.

For example, in a polymer gel, the network component is a polymer, and the polymer may be colloidally dispersed in a solvent such as water to form a gel. The polymer network may be a network formed by covalent bonds or by physical aggregation with regions of local order acting as network junctions. The gel may be physical in which case the interactions between the molecules of the dispersed component(s) are non-covalent in nature, e.g. van der Waals interactions, or it may be chemical in which case the interactions between the molecules of the dispersed component(s) are covalent. Optionally the component may be physically or chemically crosslinked. In the case of physical crosslinking, there are no covalent bonds between the molecules but the dispersed component(s) is (are) physically intertwined. In the case of chemical crosslinking there are covalent bonds between the molecules of the dispersed component(s), which have been achieved by irradiation or the addition of chemical crosslinking agents.

As used herein the term "organic" is used in its generally understood meaning, i.e. it refers to compounds which are carbon-containing compounds. As it is used here, it also includes elemental carbon, at least in the form of fullerenes. The term "organic" is further meant to exclude specific carbon-containing compounds such as: hydrogen-free chalkogenides of carbon, e.g. CO, $CO_2$, $CS_2$, and derivatives thereof, e.g. $H_2CO_3$, KSCN; further excluded are salt-like carbides which are binary compounds of elements with carbon, which decompose to hydrocarbons under the influence of water or dilute acids. Salt-like carbides have the general formula $M^1{}_2C_2$ or $M^{11}C_2$, wherein $M^1$ or $M^{11}$ denotes a metal ion with one or two valences. Salt-like carbides of calcium, silver and copper decompose to acetylene, the salt-like carbide of aluminium ($Al_4C_3$) decomposes to methane. Further excluded carbon-containing compound which do not form part of the term "organic" are metallic carbides, which are non-stoichiometric compounds having the character of an alloy. They are resistant to acids and are electrically conducting.

In accordance with the present invention, the sensitizer and emitter component(s) may be encapsulated in particles having average dimensions in the nanometer or micrometer range. If the average dimensions are in the nanometer range such particles are also sometimes herein referred to as "nanoparticles". The person skilled in the art knows how to encapsulate components in particles. There are a number of ways to encapsulate components in particles, e.g. encapsulation by emulsification techniques.

As used herein, the term "nanoparticles" is meant to denote particles which have a size in the range of 1-750 nm, preferably 5-500 nm, or more preferably 5-250 nm. These nanoparticles may also exhibit crystalline behaviour in which case they are also referred to as "nanocrystals".

As used herein, the term "nanotubes" is meant to denote tube-like structures preferably of carbon, the dimensions of which are of the same order of magnitude as of "nanoparticles", as defined above.

As used herein the terms "host molecules" and "guest molecules" are meant to denote two types of molecule, different from each other, wherein the molecules, which are referred to as "guest molecules", are embedded in a matrix formed by the (other) molecules, referred to as "host molecules".

The term "light", as used herein, is meant to refer to electromagnetic radiation in the wavelength range of from 300 nm to 1600 nm and any subset thereof.

In the devices according to the present invention involving substrates (flexible solid or rigid solid), such substrate(s) are preferably "light transparent". A substrate that is "light transparent" is meant to refer to a substrate that is transparent in at least those wavelength regions used for exciting the photon energy up-conversion medium and the wavelength region in which said photon energy up-conversion medium emits radiation. The displays in accordance with the present invention are either formed as a film or layer structure or a multi-film or multi-layer structure of the photon energy up-conversion medium in contact with at least one substrate. Preferably such medium is sandwiched between two substrates, at least one of which, preferably both are light transparent. The layered medium may have more than one layer and may also have more than one sensitiser/emitter component pair, with each pair having different absorption characteristics or different emission characteristics or both different absorption and emission characteristics. These different sensitizer/emitter component pairs may be present in different layers or different pixels of a device according to the present invention.

Without wishing to be bound by any theory, the principles of operation of the up-conversion process in accordance with one embodiment of a triplet-triplet annihilation assisted photon energy up-conversion system of the present invention is that after absorption of a photon in a singlet Q-band of the first component, e.g. a metallated porphyrin macrocycle (MOEP), due to an effective inter-system crossing (ISC), the long lived triplet state of the first component (sensitizer) is highly populated. This triplet state can further be considered as a reservoir of excited states for subsequent energy transfer processes. From here, two excitation pathways are possible. First, as a consequence of a triplet-triplet annihilation (TTA) process between the excited molecules of said first component themselves, one of the first component-molecules returns to the ground state and the other is excited into a higher singlet state. This is followed by an effective transfer of the first component singlet excitation to the excited singlet state of the second component, which is the emissive component, such as a blue emitter. Secondly, an additional up-conversion-channel is possible, comprising firstly a transfer of the triplet excitation of the first component directly to the triplet state of the second emissive component's molecules, followed again by effective triplet-triplet-annihilation, this time of the second component triplet states, resulting again in an excited singlet state of the second (emissive) component.

More preferably, said first organic dye (i.e. sensitiser) is a porphyrin, or a metalloporphyrin in particular octaethylporphyrin-Palladium (or —Pt or —Cu or —Zn), or a phthalocyanin, and said second organic dye (i.e. emitter) is a polyfluorene or oligofluorene (with or without (different) side chain patterns), in particular PF 2/6. It should be noted that, in one embodiment of the present invention, where the sensitiser and the emitter are organic compounds, which may be polymerisable, these may be occurring in the same polymer, i.e. they may form part of the same polymer molecule, either as block copolymer or random copolymer or a sensitiser/or emitter polymer wherein the respective other component forms end-capping groups. This may e.g. be a polymer of sensitiser components which is end-capped with emitter components, or vice versa. Polymers as just described are examples of where the two components are covalently bonded to each other.

Specific embodiments of preferred sensitiser components, emissive components and the matrix components ("inert matrix" referring to the fact that this is matrix does not take part in the up- or down-conversion or down-shifting processes) are described in the following:

Sensitizer molecules (or "sensitizer components")

A "sensitizer" is a molecule which is able to absorb light, the sensitizer being either an organic dye or a metal-organic complex, preferably with a high populated triplet states.

A metal-organic complex is per definition a compound containing at least a metal M surrounded by one or more molecules, the so-called ligands L which are generally bound to the metal ion by a coordinate covalent bond.

The ligands are organic molecules, cyclic or acyclic, aromatic or non-aromatic, monodentate or polydentate.

In case they are extended aromatic systems they are themselves organic dye sensitizers without being bound to a metal.

For better understanding:

Both, the Pd-porphyrine (=metal organic complex) but also the metal-free porphyrine (=organic molecule) are sensitizers.

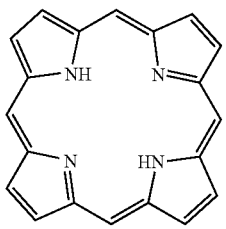

Porphirine

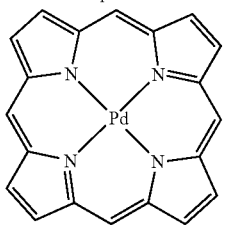

Pd-Porphirine

The metal-organic complexes can be
mononuclear with the general structure $ML_m$
with m being the number of ligands m=1-8, preferably 1-3
or
polynuclear complexes with metals bridge via a common ligand B
with general structure $L_mM\text{-}[B\text{-}ML_m]_n$, with Lm, at each occurrence in this formula, being an independently selected ligand.

n being the repeating unit 1-10, preferably 1-3
and with B being any bridging organic molecule acting as polydentate ligand or a halogenide such as F, Cl, Br, I
polynuclear complexes with ligands bridged via A
with general structure $ML_m\text{-}[A\text{-}L_mM]_n$, with Lm, at each occurrence in this formula, being an independently selected ligand.
n being the repeating unit 1-6, preferably 1-3
and with A being defined as

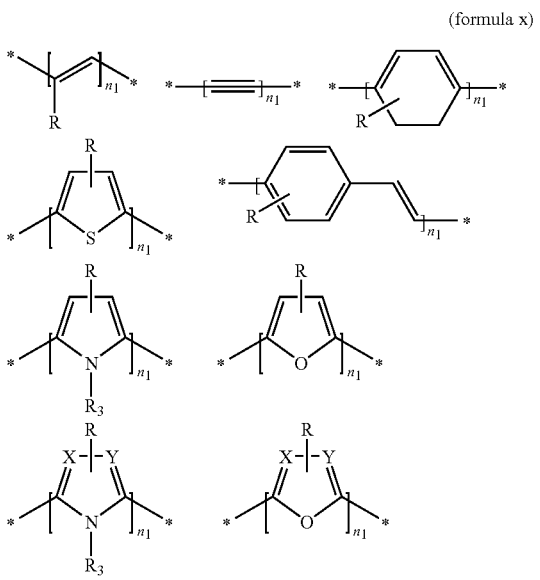

(formula x)

or any combination of these units, or any other organic unit forming fused system while bridging the ligands R being H, any substituted or non-substituted alkyl, aryl or heteroaryl
$n_1$ being 0-10, preferably 0-2
$R_3$ being H, —$(CH_2)_nCH_3$, —$(CH_2)_n$—COOR, —$(CH_2)_n$—OR, —$(CH_2)_n$—SR, —$(CH_2)_n$—$NR_2$, —$((CH_2)_p$—O$)_n$—$CH_3$, The metal M is selected for example, from Li, Na, K, Mg, Ca, Sr, Al, Ga, In, Ti, Sn, Pb, Zr, Hf, V, Nb, Cr, Mo, W, Mn, Re, Fe, Ru, Os, Co, Rh, Ir, Ni, Pd, Pt, Cu, Ag, Au, Zn, Cd, Hg, Yb, Eu, Nd, Gd, Th
preferably Pd, Pt, Ru, Os, Re, The ligand L can be selected for example, but not limited thereto, from the group of
heterocyclic aromatic or non-aromatic systems containing at least one atom which is not carbon, preferably nitrogen or oxygen, by which the ligand is linked to the metal. The said aromatic heterocyclic aromatic or non-aromatic system is a mono- or polycyclic condensed ring system or a system of rings covalently bonded to each other, wherein, optionally, said ring system or rings are substituted with further substituents Z, with Z being
one or more moieties which, at each occurrence, is independently selected from H, substituted or non-substituted alkenyl or alkynyl, or halogen, such as Cl, Br, F, I, or $NO_2$, $NH_2$, CN, $SO_3H$, OH, H, —$(CH_2)_nCH_3$, —$(CH_2)_n$—COOR, —$(CH_2)_n$—OR, —$(CH_2)_n$—SR, —$(CH_2)_n$—$NR_2$, —$((CH_2)_p$—O$)_n$—$CH_3$,
with R being H, any substituted or non-substituted alkyl, aryl or heteroaryl
n being 0-10, preferably 0-6
and p being 0-4, preferably 1-2
or any aromatic and heteroaromatic system, preferably represented by formula x

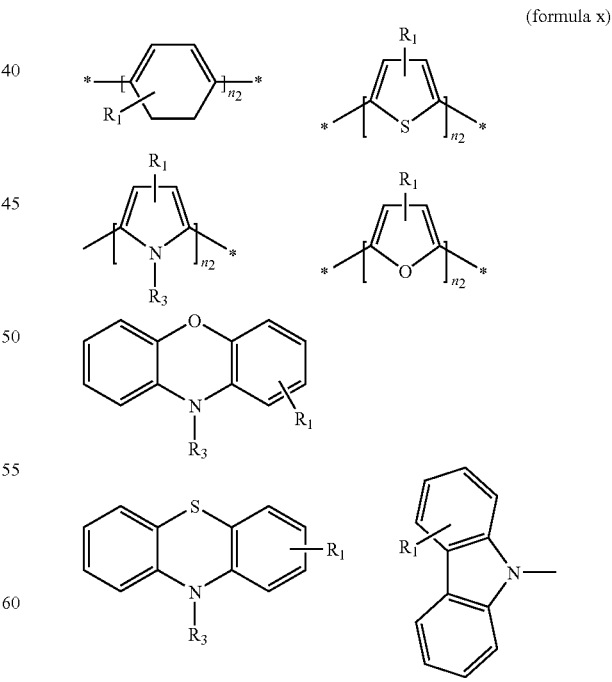

(formula x)

$n_2$ being 1-5
$R_1$ being H, any alkenyl, alkynyl, aryl or halogen, such as Cl, Br, F, I, or $NO_2$, $NH_2$, —CN, —SCN, =$C(CN)_2$, =O, —SO$_3$H, OH, H, —(CH$_2$)$_n$CH$_3$, —(CH$_2$)$_n$—COOR, —(CH$_2$)$_n$—OR, —(CH$_2$)$_n$—SR, —(CH$_2$)$_n$—NR$_2$, —((CH$_2$)$_p$—O)$_n$—CH$_3$, R$_3$ being H, —(CH$_2$)$_n$CH$_3$, —(CH$_2$)$_n$—COOR, —(CH$_2$)$_n$—OR, —(CH$_2$)$_n$—SR, —(CH$_2$)$_n$—NR$_2$, —((CH$_2$)$_p$—O)$_n$—CH$_3$, The ligand L can be selected for example, but not limited thereto, from the class of substituted or non-substituted macrocyclic systems of porphyrines including and also extended systems of these derivatives, such as benzoporphyrines or naphthaloporphyrine.

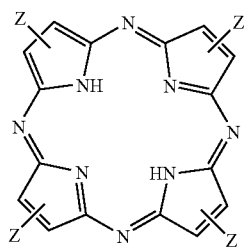

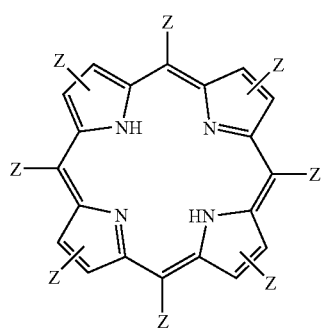

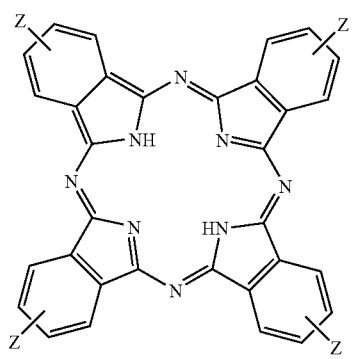

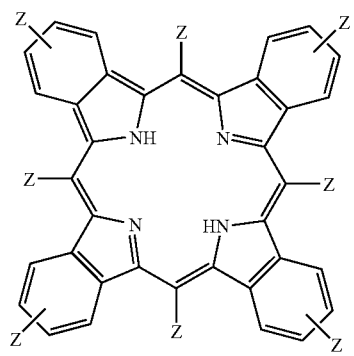

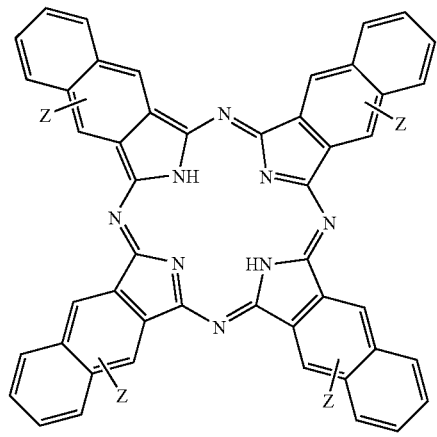

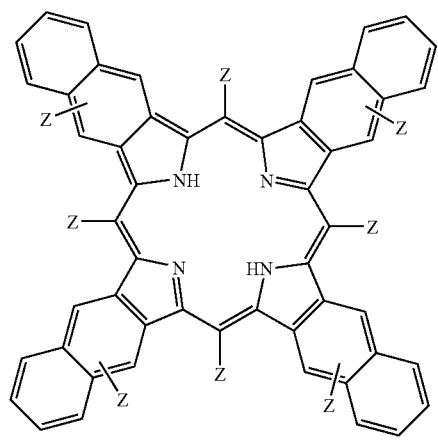

The ligand L can be selected for example, but not limited thereto, from the class substituted or non-substituted macrocyclic systems of tetraazaporphyrine, phthalocyanine or naphthalocyanine.

The ligand L can be selected for example, but not limited thereto, from the class of substituted or non-substituted macrocyclic systems of corroles or aza-corroles including their benzo- and naphto-extended systems.

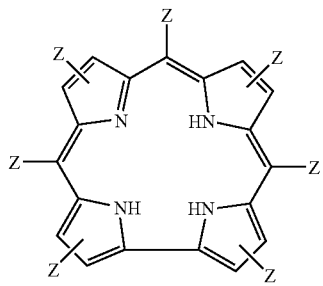

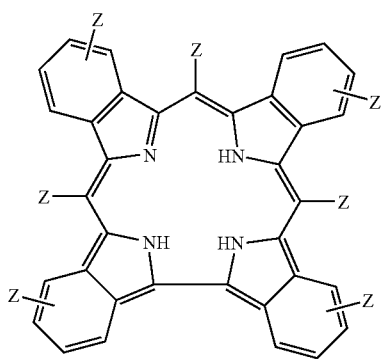
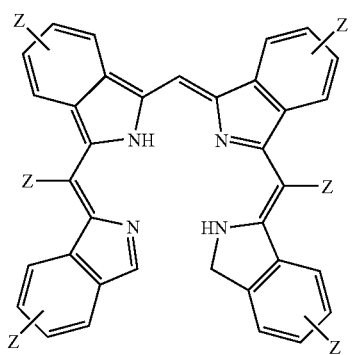
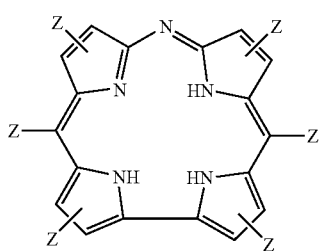
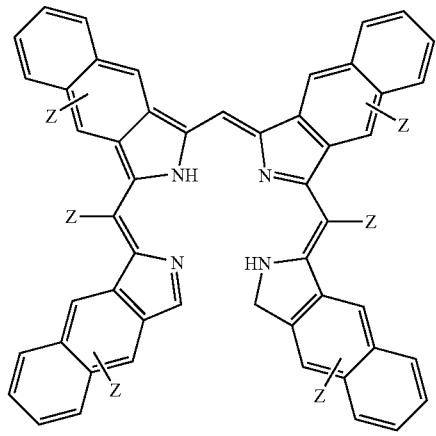
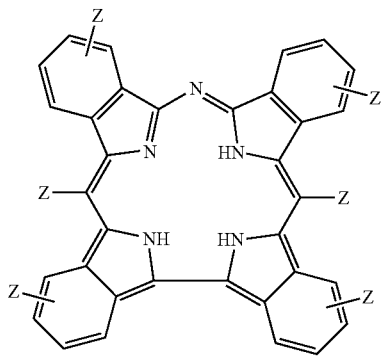
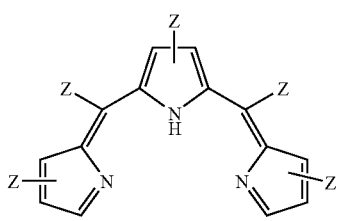
The ligand L can be selected for example, but not limited thereto, from the class of substituted or non-substituted linear tetra-, tri- or dipyrrole systems, including their benzo- and naphto-extended systems
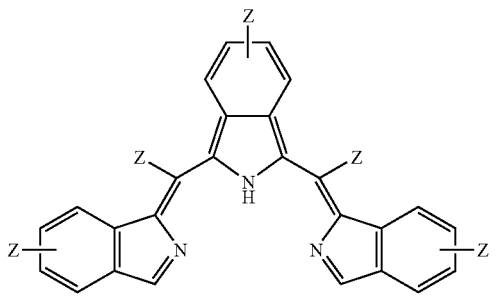
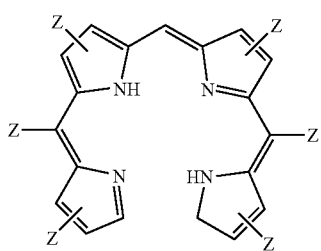
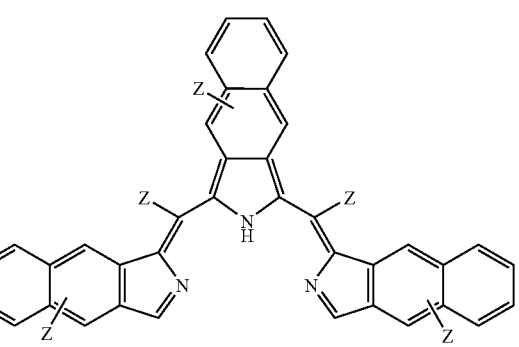

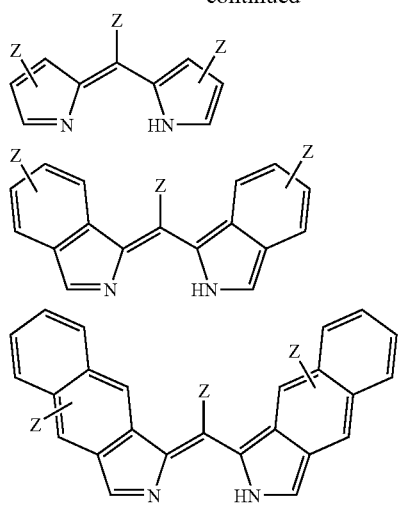

The ligand L can be selected for example, but not limited thereto, from the class of substituted or non-substituted pyridine, bi-, ter- or poly-pyridyls, phenantrolines, quinoline, isoquinoline, bis-isoquinoline, hydroxyquinoline

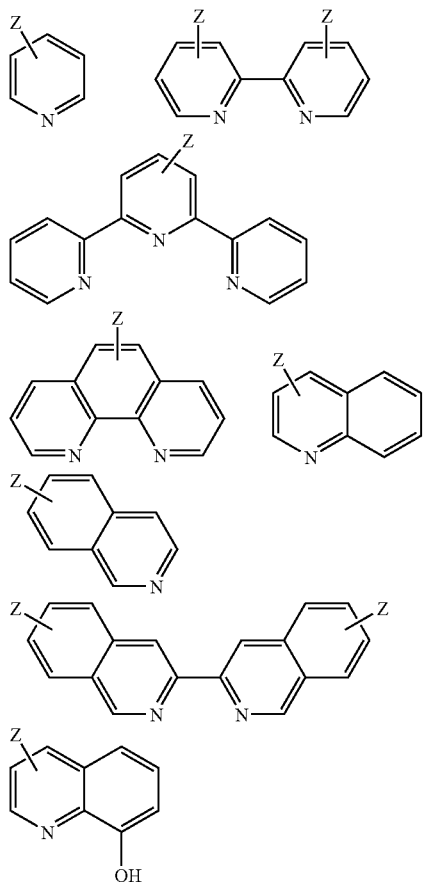

The ligand L can be selected for example, but not limited thereto, from class of substituted or non-substituted heteroaromatics molecules represented by the structures and any combination of the structures

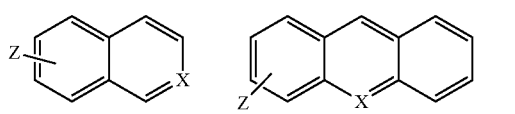
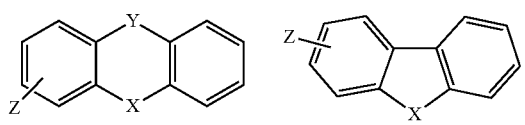
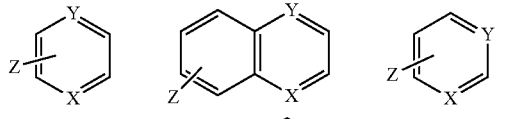
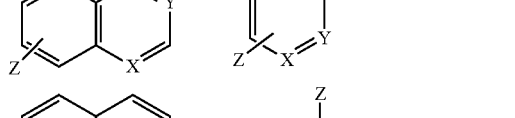
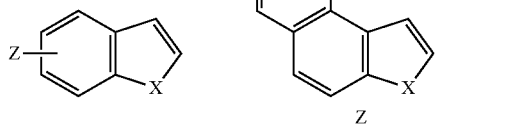
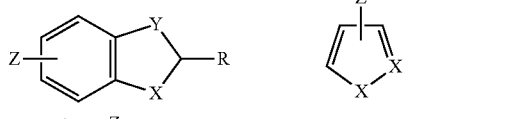

with X and Y being independent from each other NR, O, S

The ligand L can be selected for example, but not limited thereto, from derivatives containing substituted or non-substituted benzene-1,2-diol; benzene-1,2-diamine; ethane-1,2-diamine; ethane-1,2-diol; naphthalene-2,3-diamine; naphthalene-2,3-diol; anthracene-2,3-diol; anthracene-2,3-diamine; oxalamide, oxalic acid, ethylendiamintetraacetic acid

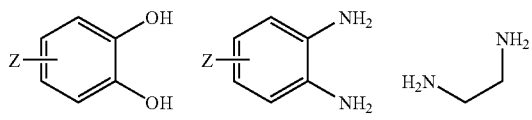
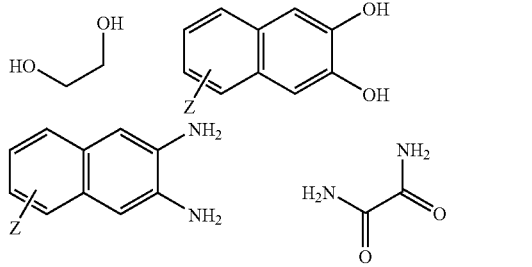

-continued

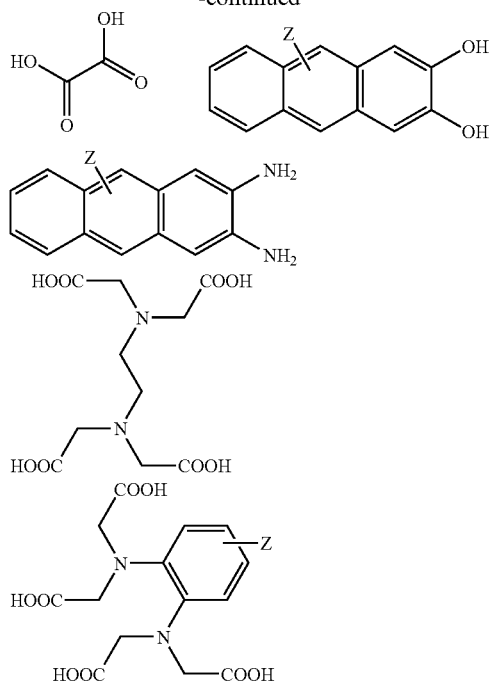

Sensitizers which are organic dyes are selected, but not limited thereto, from the class of substituted or non-substituted coumarins and their derivatives,

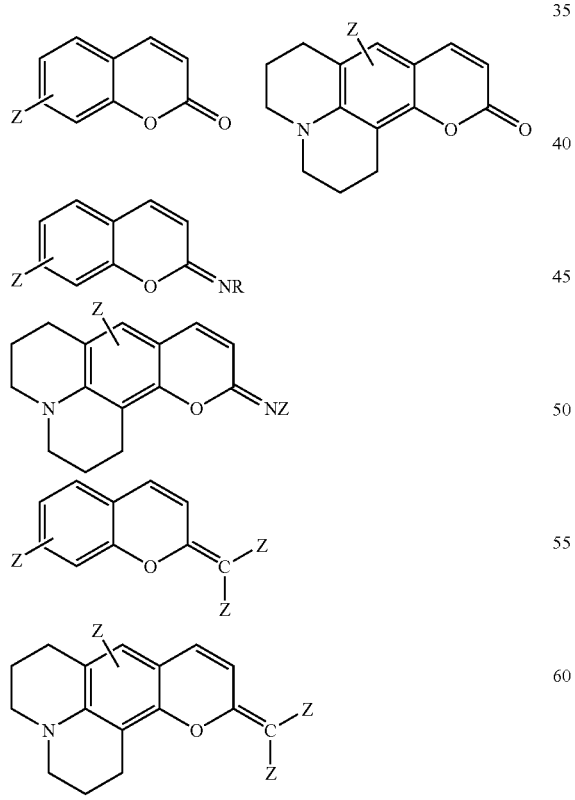

with Z as described above substituted or non-substituted cyanine-, merocyanine-, and azo-dyes and their derivatives.

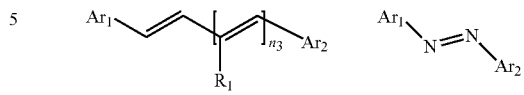

with $n_3$=0-6, preferably 0-3

With $Ar_1$ and $Ar_2$ being same or different, at each occurrence independently selected from

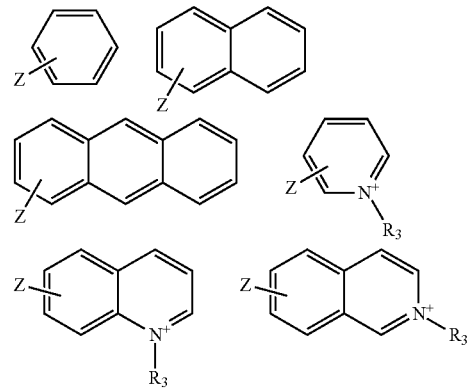

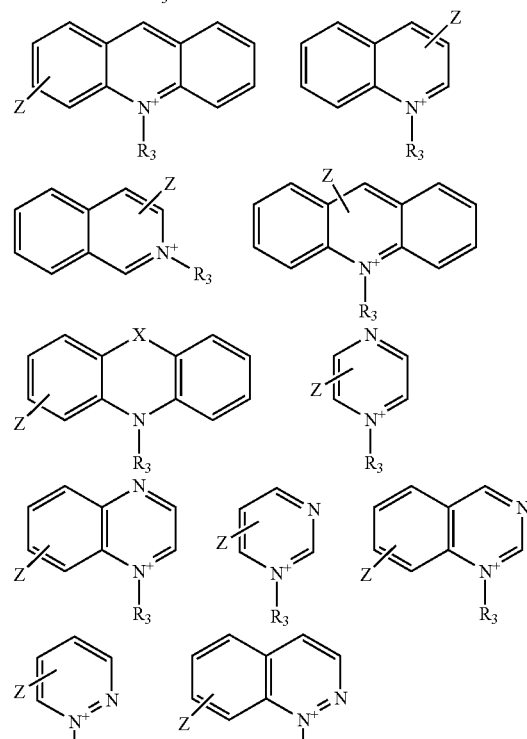

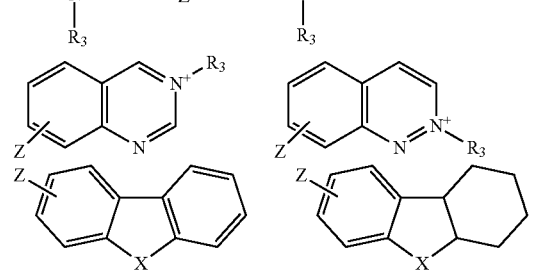

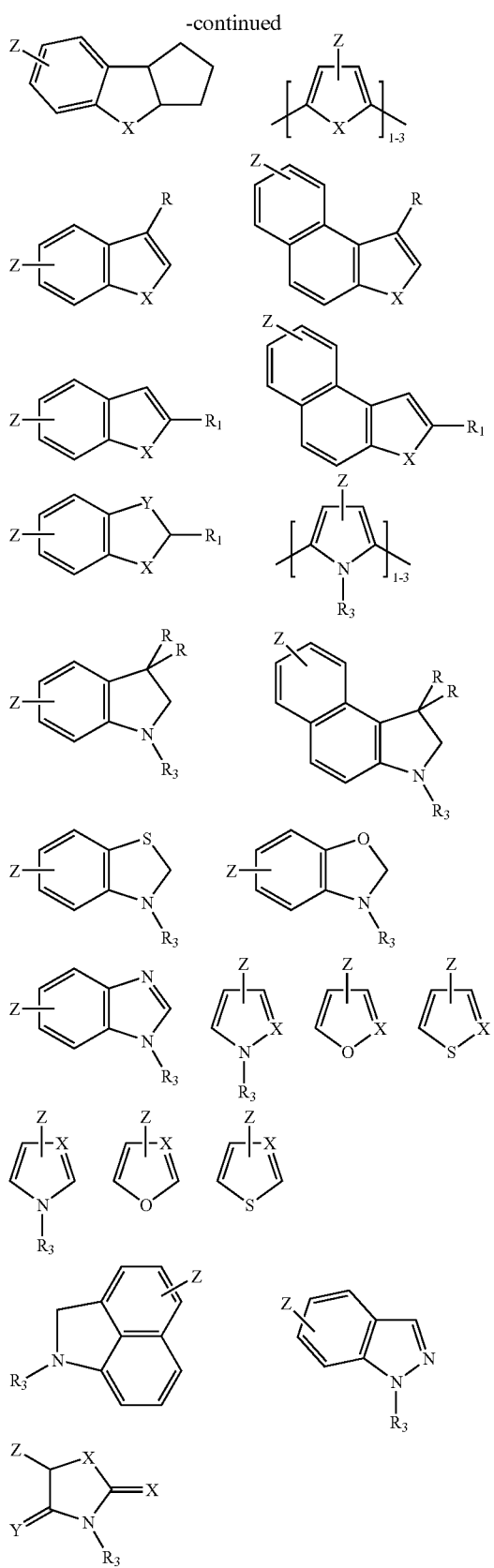

or any combination of these structures
with Z, R, and $R_3$ as defined above substituted or non-substituted derivatives of squarylium and croconium dyes

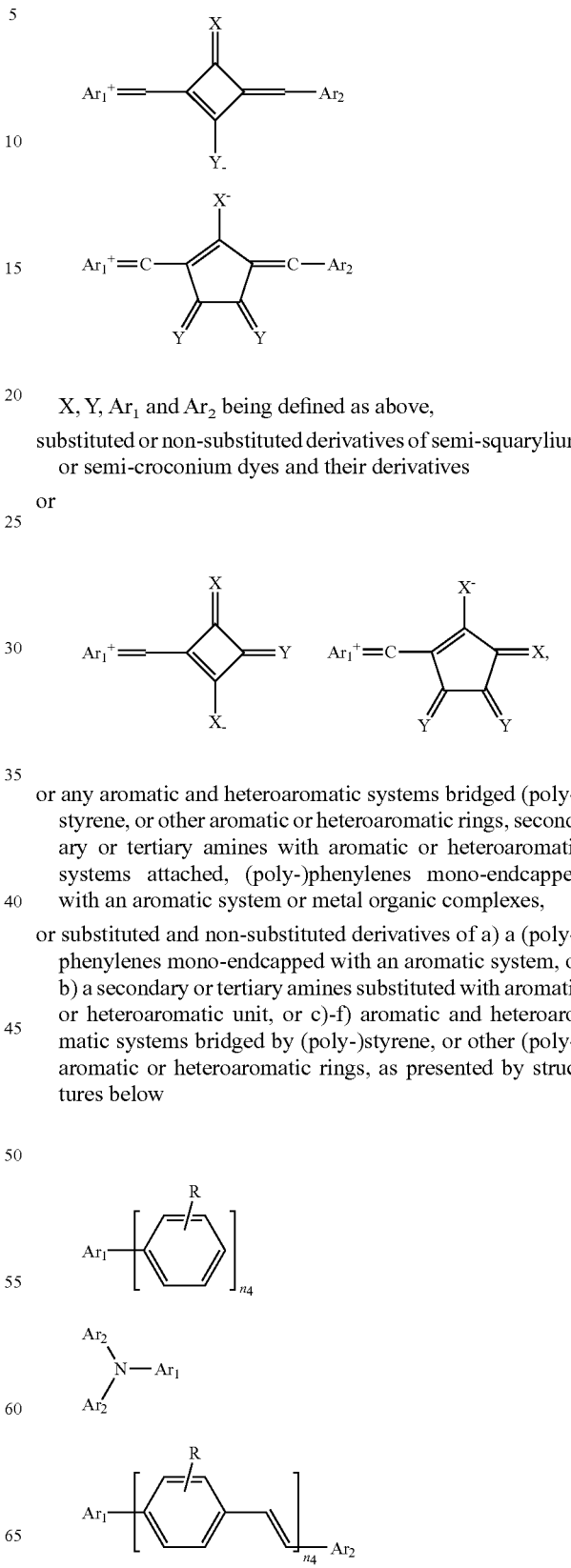

X, Y, $Ar_1$ and $Ar_2$ being defined as above, substituted or non-substituted derivatives of semi-squarylium or semi-croconium dyes and their derivatives or or any aromatic and heteroaromatic systems bridged (poly-)styrene, or other aromatic or heteroaromatic rings, secondary or tertiary amines with aromatic or heteroaromatic systems attached, (poly-)phenylenes mono-endcapped with an aromatic system or metal organic complexes, or substituted and non-substituted derivatives of a) a (poly-)phenylenes mono-endcapped with an aromatic system, or b) a secondary or tertiary amines substituted with aromatic or heteroaromatic unit, or c)-f) aromatic and heteroaromatic systems bridged by (poly-)styrene, or other (poly-)aromatic or heteroaromatic rings, as presented by structures below

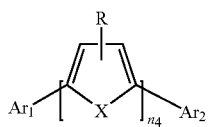

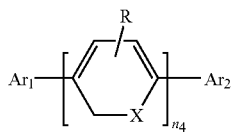

With $n_4$=1-4, preferably 1-2
Ar1, Ar2, X and R as described above.

Organic dye can be also selected from the class of ligands L, such as the class of porphyrine, phtalocyanine, corroles, which are not bound to a metal.

Emitter molecules (or "emissive components") are organic molecules with emitting singlet states (efficient)

The emitter molecules can be selected from the group of E.

E can be selected for example but not limited from the class of substituted or non-substituted anthracenes, naphthacenes, pentacenes, rubrene and their derivatives, the core being expressed by the structures

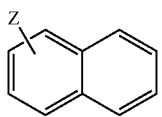 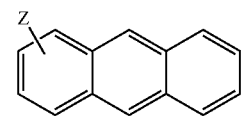

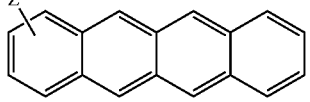

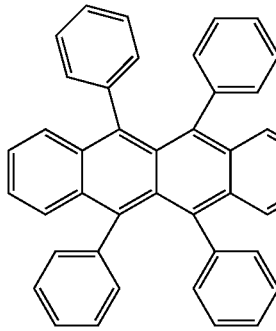

with Z being as described above substituted or non-substituted perylenes, phenanthrenes, triphenylenes, pyrenes, benzo-pyrenes, chrysene, benzo-crysenes, phenalene, acenaphtylene, corannulene, the cores being expressed by the structures

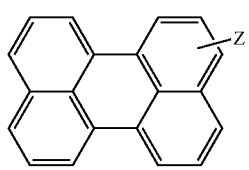 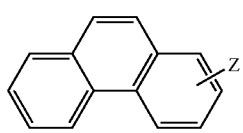

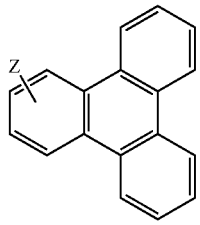 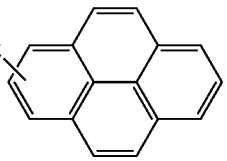

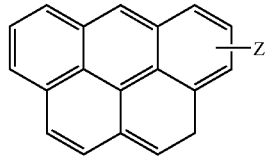

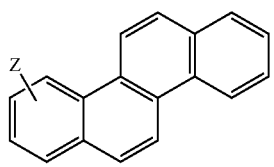

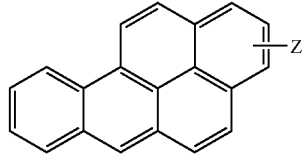

with Z being as described above substituted or non-substituted of derivatives containing non-aromatic, aromatic and heteroaromatic fused systems, the cores being expressed by the structures

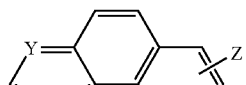

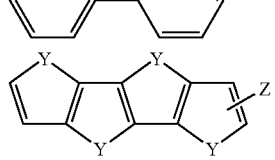

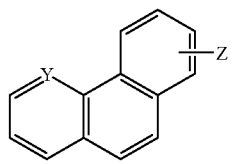

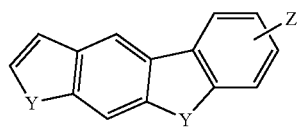

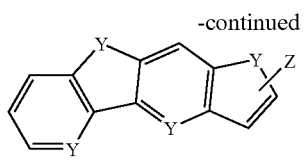

or any combination of these structures
with Z being as described above
with Y being C, Si, N, S, O
substituted or non-substituted of class of (poly)-silole or -pyrrol or thiophene based compounds, the cores being expressed by the structures

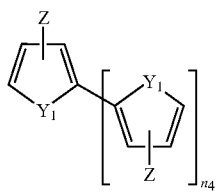

With Z and $n_4$ as described above
And Y1 being $Si(Z)_2$, —N(Z) or S.

The emitter molecules can be also molecules expressed by general formula below

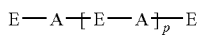

With p being 0 to 20
With E and A as defined above and with Lm, when appearing, at each occurrence in this formula, being an independently selected ligand.

Inert matrix, i.e. matrix in which sensitizer and emissive component are distributed;

Reasonably transparent in the VIS and near-IR region, with defined variable viscosity Examples, but not limited to:

Oligomers and co-oligomers—styrenes, methylmetacrylates, phenols, acrylic acid, vinyl alcohol, carbonate, imide, amide, ethylene, ethylene glycols, propylene, propylene glycols, in general olefins and olefin glycols, terephthalic acid, epsilon-caprolactone, and substituted and functionalised styrenes, methylmetacrylates, acrylic acid, vinyl alcohol, carbonate, imide, amide, ethylene, ethylene glycols, propylene, propylene glycols, in general olefins and olefin glycols and all possible mixtures thereof and with organic solvents or water to vary and control viscosity Polymers and copolymers (block, alternating and/or graft copolymers) with molecular weights from $10^3$ to ca. $10^9$: e.g. but not limited to: polystyrenes, polymethylmethacrylates, in general all polyacrylics, polycarbonates, polyethylenes, polypropylenes, polymethylpentane (in general polyolefins), polyethylene naphtalate, polyethylene therephthalate, polyimides, polyetherimides, polyamides, polyetheretherketones, polyhydroxybutyrates, poly-L-lactic acids, polyepsilon-caprolactone, polyethylene oxides, polypropylene oxides, i.e. polyethylene and polyalcylene glycols, all the mixtures and blends thereof, as well as with organic solvents or water to vary and control viscosity.

Physical and chemical polymer gels:
a) irradiation crosslinking (all oligomers and polymers described above, but not limited to, as well as their mixture as well with low molecular weight solvents to adjust viscosity
reactive crosslinking (epoxy-resines, etc.)

All of the organic systems of the prior art reported above are solution based. Hence their application in devices is difficult and requires sealed compartments. The present inventors have devised media for photon energy up-conversion which are based on organic sensitizers and emitters and which comprise a matrix that allows the deposition of such media as a film over extended areas In particular, in some embodiments of the invention, a "sensitiser" is a non-linear absorber which means that it shows absorption characteristics which do not show linear behavior, in particular with light at high incident irradiation. Where the absorption is the result of a direct two-photon-excitation process, the sensitiser has to have a high enough TPA cross-section. In the case where there is a sequential two-multi-photon excitation, whereby the sensitiser becomes an optical limiting compound, in most cases it is a reverse saturable absorber (RSA). These systems are defined as having an absorption in the excited state (singlet or triplet) higher than the absorption of the ground state. The performance of these compounds is characterized by the ratio of the excited state—to the ground-state-absorption (including singlet and triplet levels) and by the saturation intensity or fluence. For a good performance (i.e. for a good up-conversion behavior) the ratio of the excited-state-absorption to ground-state-absorption is large, whereas the saturation intensity or-fluence is low.

The "emitter" component (i.e. the second component) ought to have an emissively relaxing excited energy level at a position to which the excitation energy transfer can take place from any of the high excited states (i.e. singlet Sn or triplet Tn) of the sensitiser component. Furthermore a higher fluorescence quantum efficiency of the emitter component is important and preferred.

As used herein the term "organic" is used in its generally understood meaning, i.e. it refers to compounds which are carbon-containing compounds. As it is used here, it also includes elemental carbon, at least in the form of fullerenes. The term "organic" is further meant to exclude specific carbon-containing compounds such as: hydrogen-free chalkogenides of carbon, e.g. CO, $CO_2$, $CS_2$, and derivatives thereof, e.g. $H_2CO_3$, KSCN; further excluded are salt-like carbides which are binary compounds of elements with carbon, which decompose to hydrocarbons under the influence of water or dilute acids. Salt-like carbides have the general formula $M^1{}_2C_2$ or $M^{11}C_2$, wherein $M^1$ or $M^{11}$ denotes a metal ion with one or two valences. Salt-like carbides of calcium, silver and copper decompose to acetylene, the salt-like carbide of aluminium ($Al_4C_3$) decomposes to methane. Further excluded carbon-containing compound which do not form part of the term "organic" are metallic carbides, which are non-stoichiometric compounds having the character of an alloy. They are resistant to acids and are electrically conducting.

EXAMPLES

In the following reference is now made to the figures which are given as examples, wherein FIG. 1 shows a proposed energetic scheme of a triplet triplet annihilation (TTA) supported up-conversion process. The dotted path represents the transfer of excitation energy by the up-conversion in the anthracene derivative/metallated macrocycle system. For instance, for the up-conversion couple BPEA/PdPh$_4$TBP, then the energy of the excitation photons is 1.98±0.08 eV, whereas the energy of the emitted photons is 2.5±0.1 eV. It is that the optimum when the energetic position of the triplet manifold the sensitizer and emitter have spectral overlap.

FIG. 2 shows the excitation spectra (2A top spectrum) together with emitter spectra (2A bottom spectrum) for possible pair sensitizer/emitter for stepwise photon energy up-conversion of the Sun-light. More specifically, FIG. 2A, bottom spectrum, shows the up-conversion fluorescence spectrum of couple DPA/PdOEP (navy line), BPEA/PdTPTBP (dark cyan line) and BPEN/PdTPTNP (orange line) in solution, excitation intensity 1 Wcm$^{-2}$ Sun light The systems are $1 \cdot 10^{-3}$M DPA/$1 \cdot 10^{-4}$M PdOEP (navy line), $1 \cdot 10^{-3}$M BPEA/$1 \cdot 10^{-4}$M PdTPTBP (dark cyan line) and $1 \cdot 10^{-3}$M$^{-3}$BPEN/$1 \cdot 10^{-4}$M PdTPTNP (orange line), respectively. The emission spectra were registered by optical fibre-spectrometer in lateral direction without using any further blocking optical filters. The integral non-coherent excitation power was 10mW and the excitation spot diameter $(1/e) \sim 1.8 \cdot 10^{-3}$ m, e.g. the excitation intensity was as low as 1 Wcm$^{-2}$. (DPA=9,10 diphenylanthracene; PdOEP=2,7,8,12,13,17,18-octaethyl porphyrine palladium BPEA=Bis(phenylethynyl)anthracene; PdTPTBP=meso-tetraphenyl-tetrabenzoporphyrine palladium; BPEN=9,10-Bis(phenyl ethynyl)naphthacenyl; PdTPTNP=meso-Tetraphenyl-octamethoxide-tetranaphtho[2,3]porphyrine palladium).

FIG. 2A, top spectrum, shows the regions of the Solar spectrum (grey line)—near 550 nm (green line), 630 nm (red line) and 700 nm (dark red line), respectively, as excitation spectra.

In these experiments the following experimental setup was used: firstly, in order to reduce the thermal stress for the optical elements, the infrared tail of the solar spectrum (wavelengths longer than 750 nm) was rejected through the use of a large size (12") interference filter (AHF Analysentechnik GmbH) before focusing onto the face of the optical fiber. Finally, the necessary excitation sunlight band was selected by using a broad band interference filter at the output of the optical fiber. The light intensity at the focal spot was in the order of 1 Wcm$^{-2}$. The cw-fluorescence spectra excited in the regime of up-conversion are shown for systems consisting of $1 \cdot 10^{-3}$M DPA/$1 \cdot 10^{-4}$M PdOEP (navy line), $1 \cdot 10^{-3}$M BPEA/$1 \cdot 10^{-4}$M PdTPTBP (dark cyan line) and $1 \cdot 10^{-3}$M$^{-3}$BPEN/$1 \cdot 10^{-4}$M PdTPTNP (orange line), respectively. The emission spectra were registered by optical fibre-spectrometer in lateral direction without using any further blocking optical filters. The integral non-coherent excitation power was 10 mW and the excitation spot diameter $(1/e) \sim 1.8 \cdot 10^{-3}$ m, e.g. the excitation intensity was as low as 1 Wcm$^{-2}$.

Figure 2A:
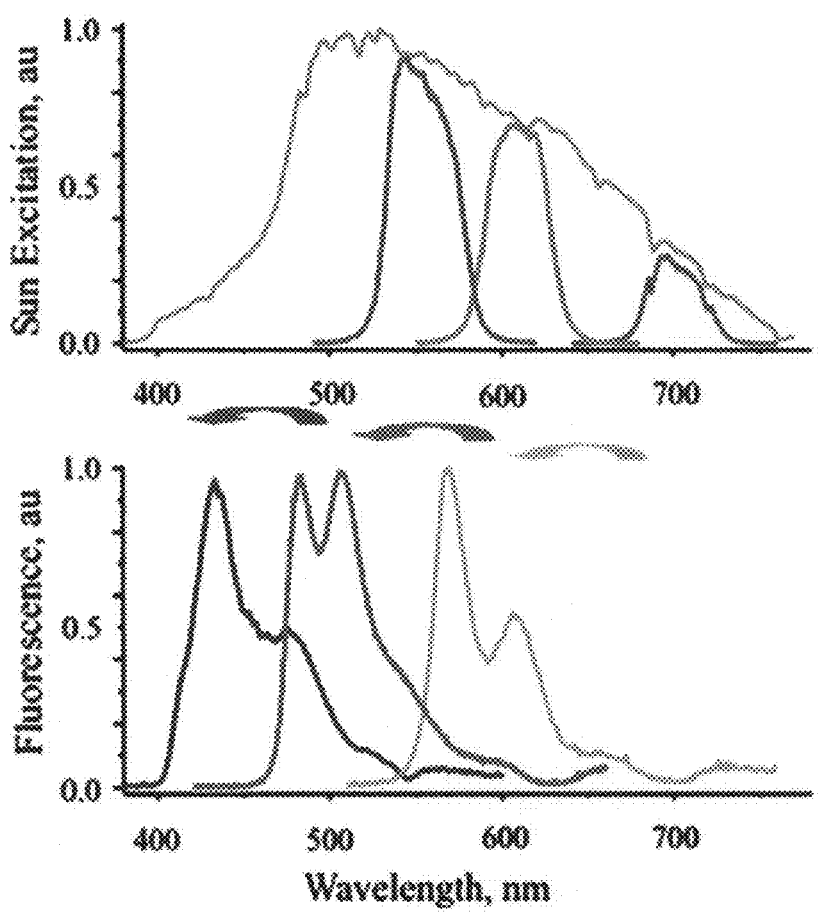
FIG. 2B shows a CCD-camera image of the up-converted fluorescence inside a 1 cm cuvette, for the systems DPA/PdOEP, BPEA/PdTPTBP and BPEN/PdTPTNP in PS400 Da (polystyrene 400 Da) as matrix, excited with the corresponding part of the Sun's spectrum, 1 Wcm$^{-2}$. For the CCD-images no blocking filters were used.
FIG. 2c shows a Dobsonian telescope (12" Lightbridge, Meade Ins. Corp.) which was used to collect the sun light and couple it into an optical fiber (Multimode, 1000 μm, NA=0.48, Thorlabs Inc.).
Figure 2B:
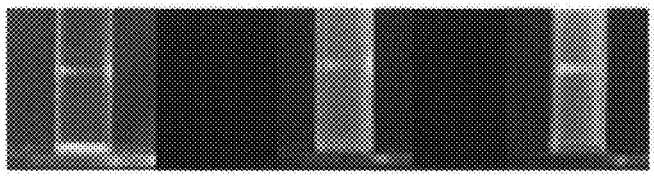
Figure 2C:
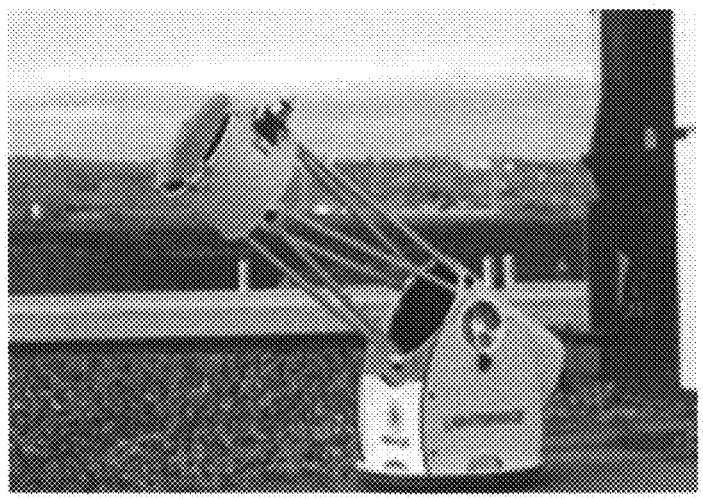
Figure 3A:
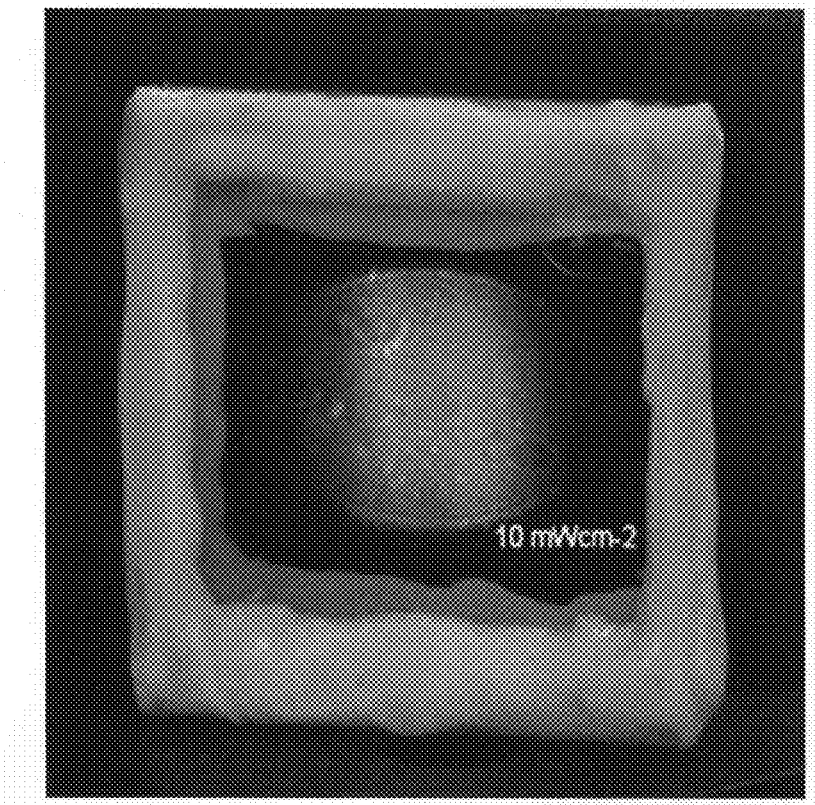
Figure 3B:
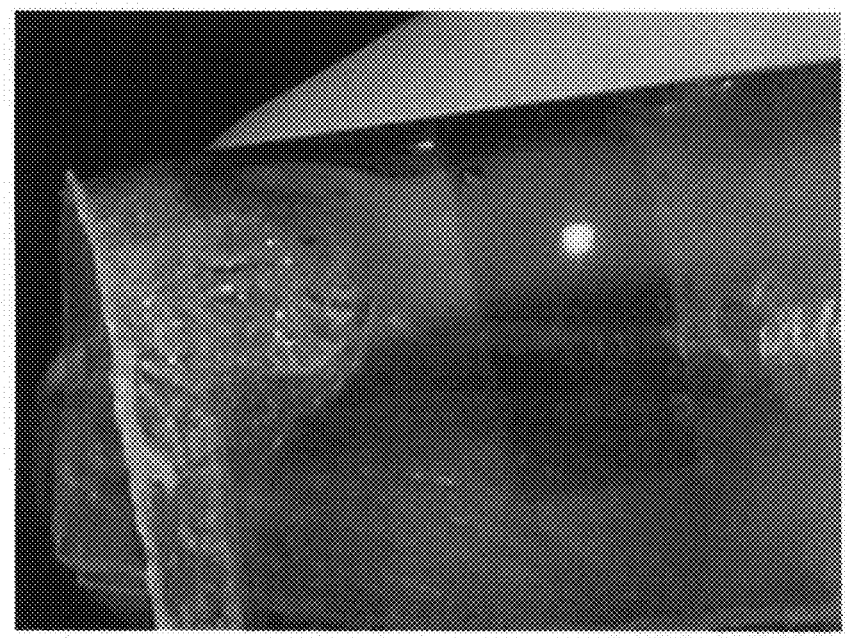
Figure 3C:
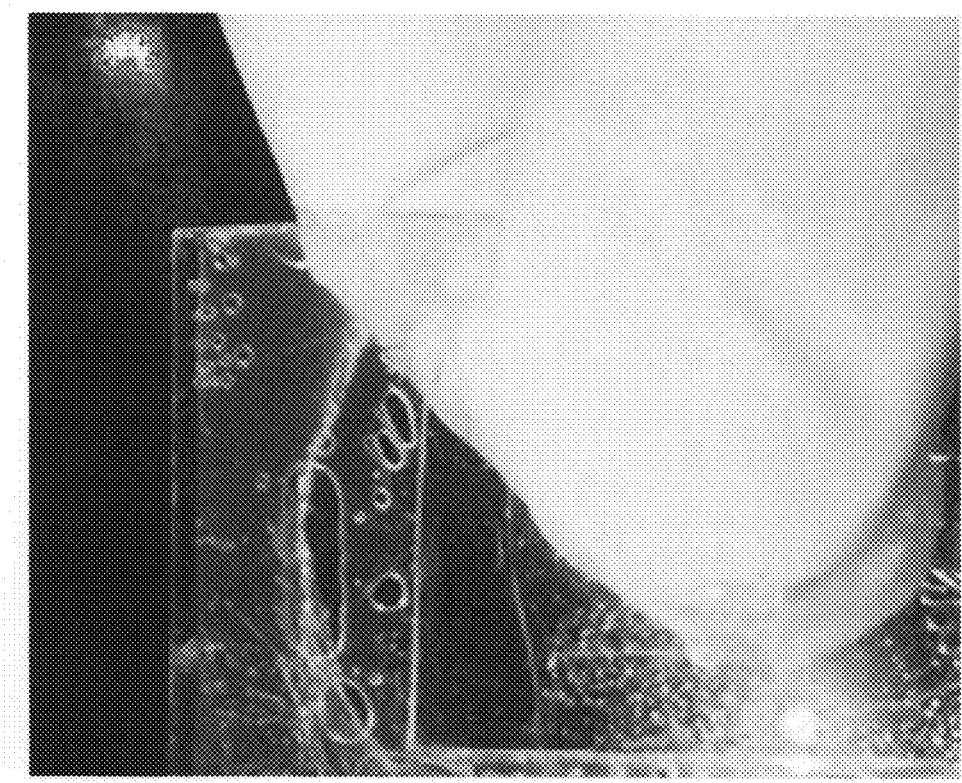

FIG. 3 shows the application of photon energy up-conversion media as upconverters of red to blue and yellow light for a solar cell, more specifically, FIG. 3 shows;
PdTPTBP with Perylene (FIG. 3A)
Glass substrates, sealed,
PS400 Da as matrix, 10 mWcm$^{-2}$ Laser diode 635 nm excitation. Sample size is 1 inch$^2$
PdTPTBP with Rubrene (FIG. 3B)
Flexible substrates, non-sealed
Viscous PS 400 Da as matrix; viscosity approximately $20 \times 10^{-3}$Pa·s, excitation is 100 mWcm$^{-2}$ laser diode 635 nm.
PdTPTBP with Rubrene (FIG. 3C)
Substrates less flexible, but polycarbonate, non-sealed
Viscous PS 400 Da as a matrix; (viscosity approximately $20 \times 10^{-3}$Pa·s, excitation is 100 mWcm$^{-2}$ laser diode 635 nm.

Figure 4A:
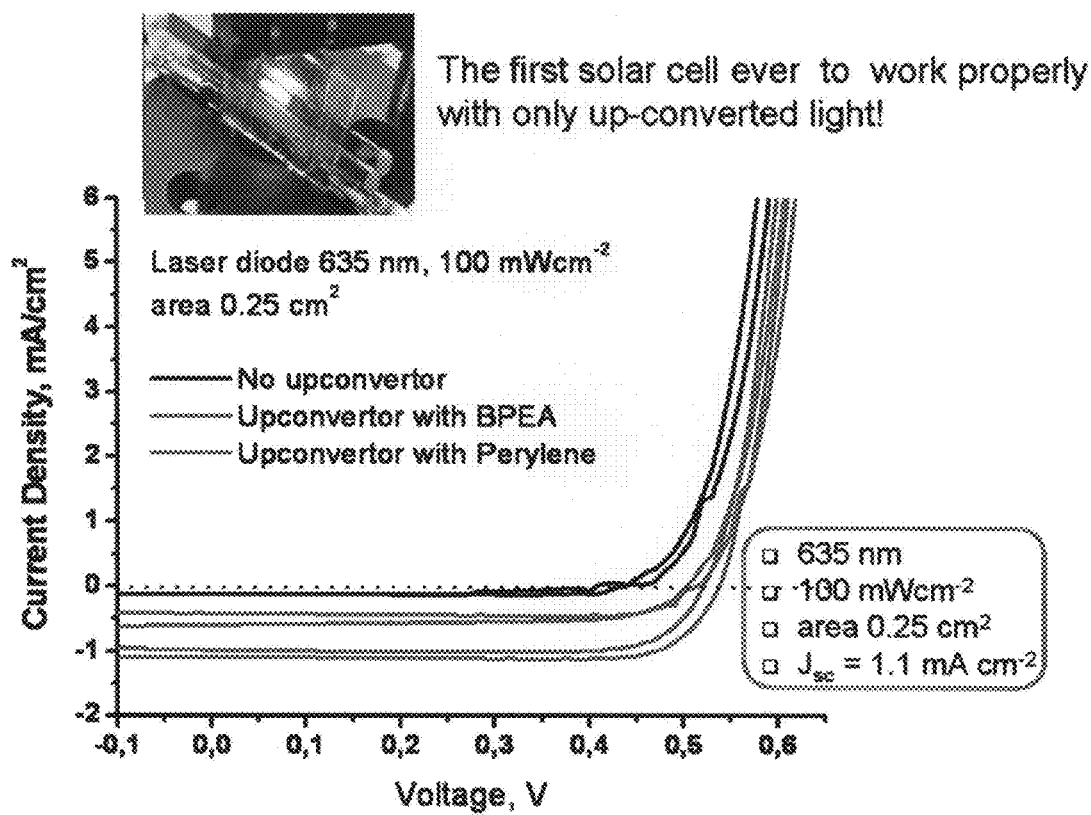

FIG. 4 shows the proof of principle of using photon energy up-conversion media as solar spectrum concentrators in a solar cell; more specifically in FIG. 4A) the inventors used BPEA/PdTPTBP and Perylene/PdTPTBP as up-conversion couples (picture of the experiment with this one is shown in the inset of the figure). From the graphic at the right hand side is evident, that without up-converting concentrator the solar cell produced vanishing amounts of current when excited only with □=635 nm (the black line form the JV-curve). Correspondingly, when BPEA/PdTPTBP un-convertor is used (the green line) or Perylene/PdTPTBP (the blue line) substantial increase of the current density is observed (more than 10 times) by exciting in all measurements with the same light intensity of 200 mWcm$^{-2}$. This is, to the best knowledge of the inventors, the first solar cell to work properly with up-converted light.

Figure 4B:
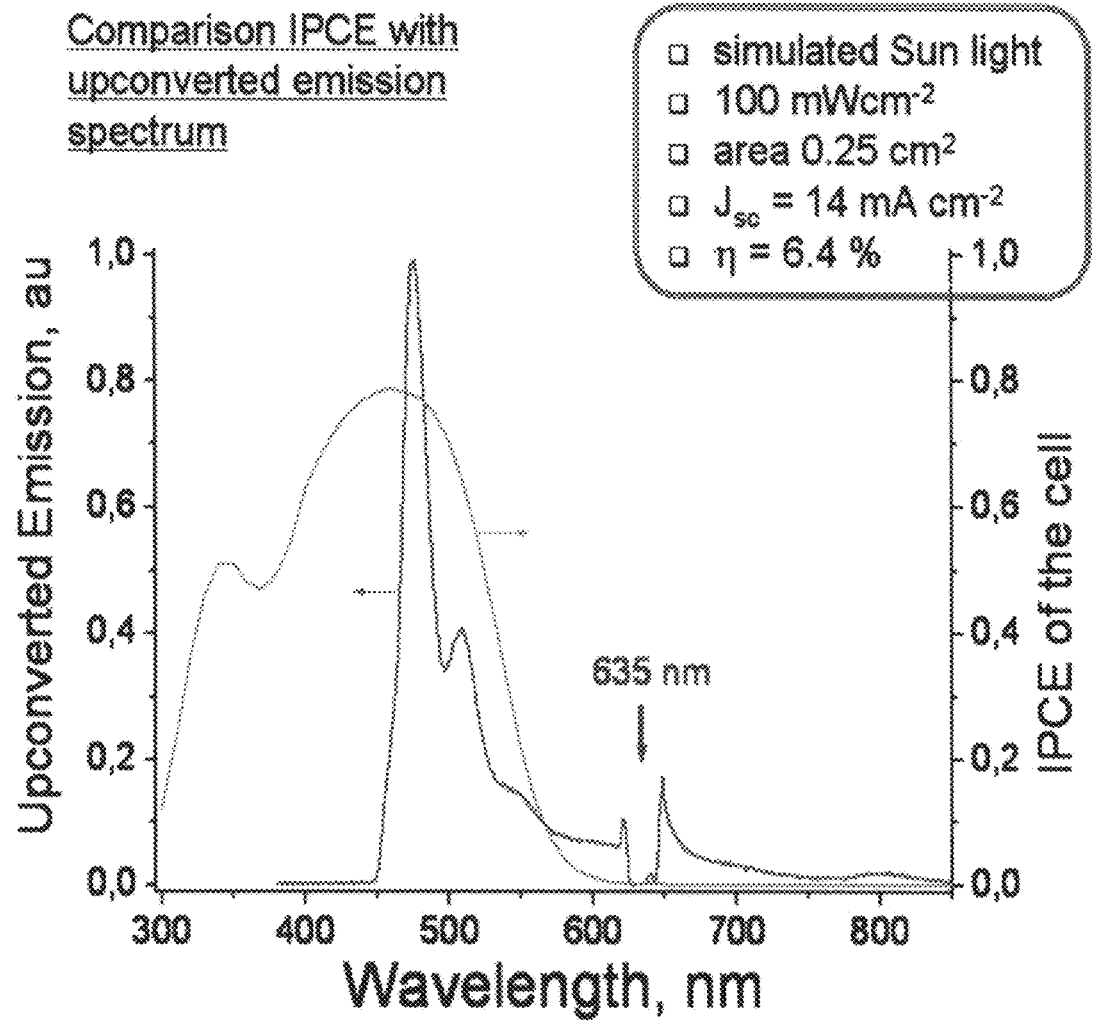

In FIG. 4B, the solar cell with both demonstrated up-converters shows a significantly better efficiency than the solar cell without up-converting concentrator as the cell is chosen not to work with longer than 600 nm wavelengths (B)

Figure 6:
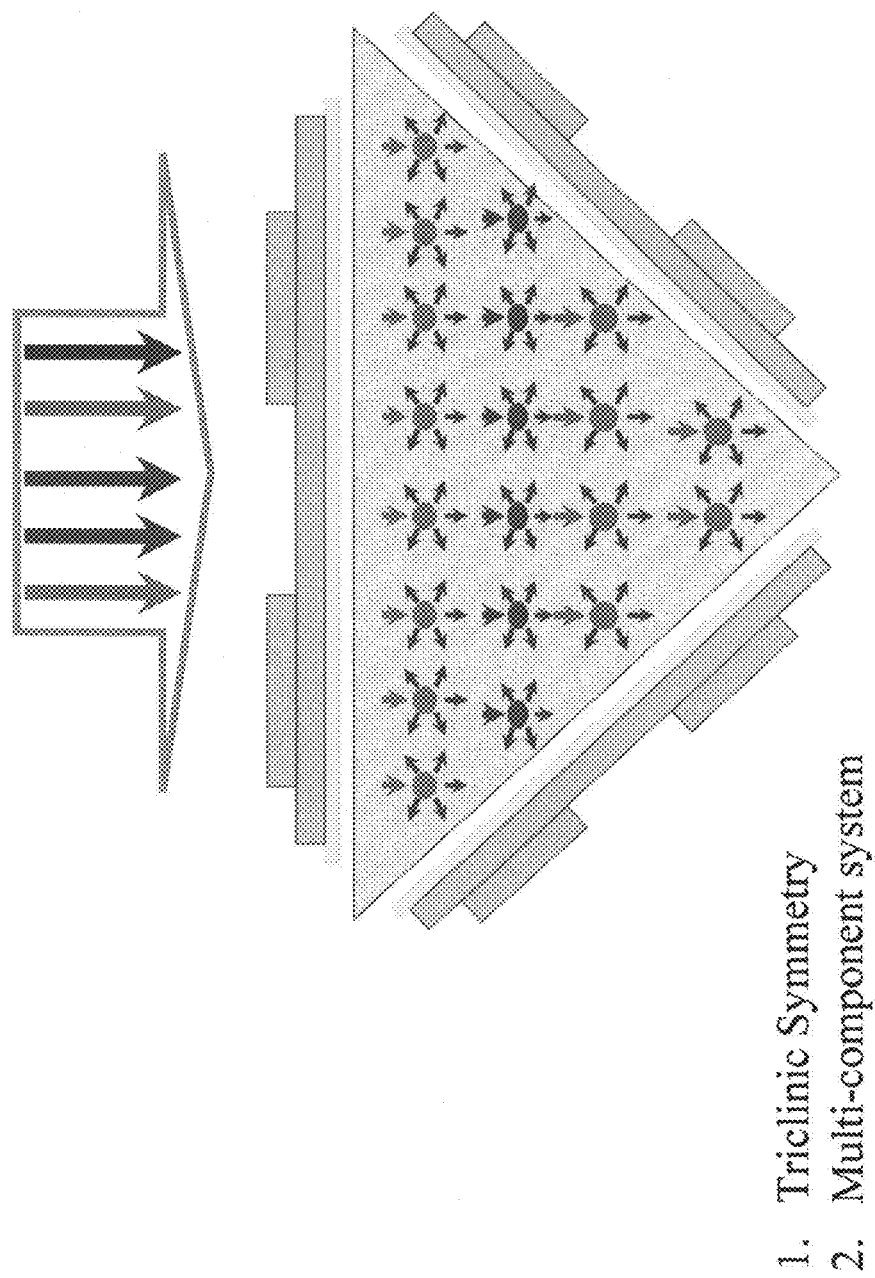
Figure 7:
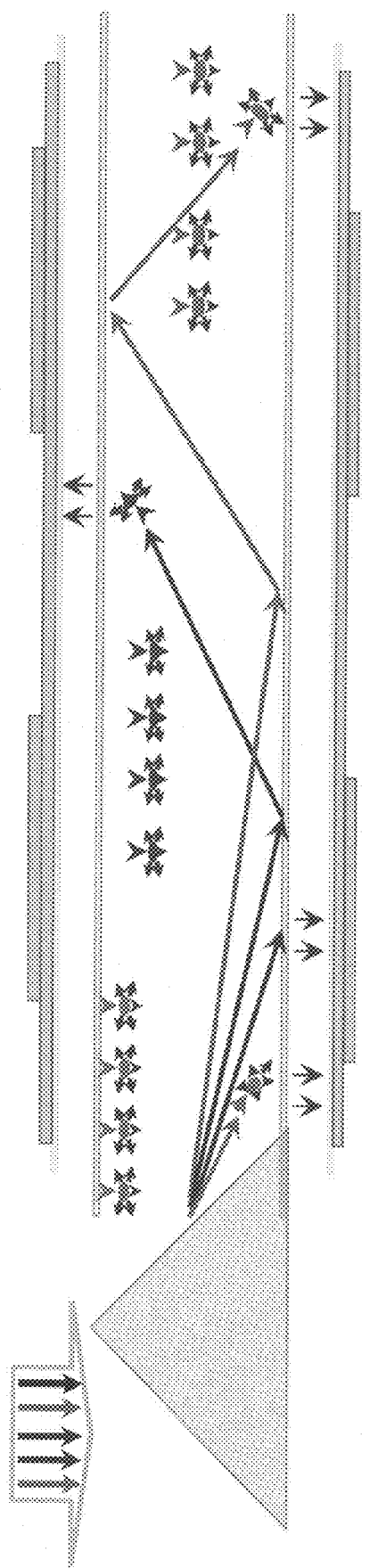
Figure 8A:
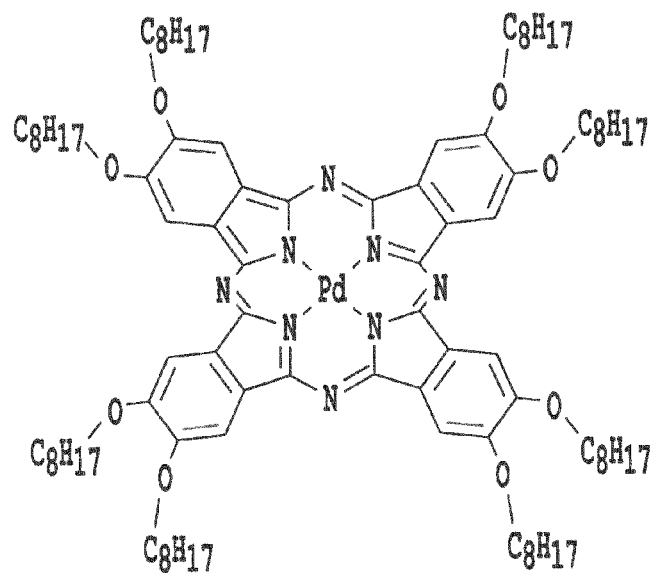
Figure 8B:
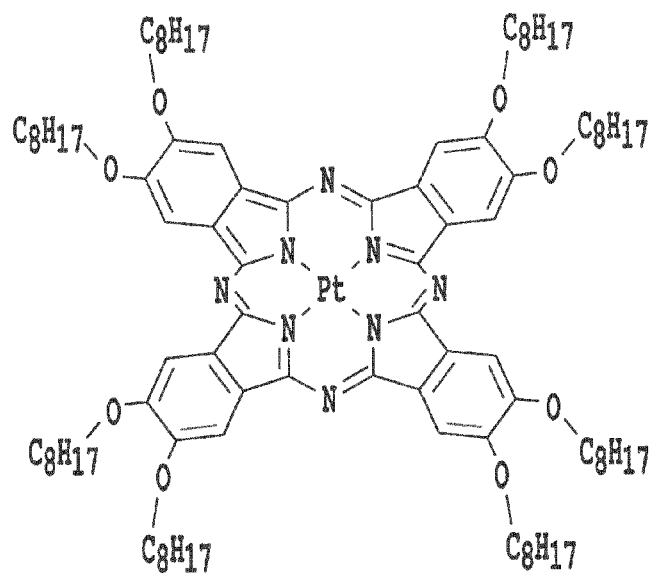
Figure 8C:
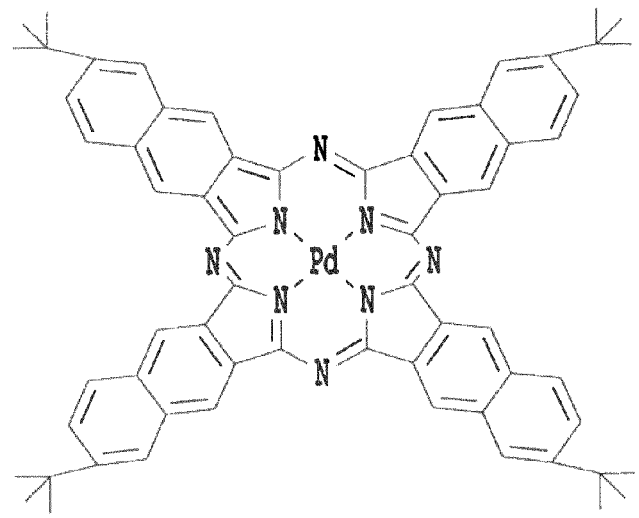
Figure 8D:
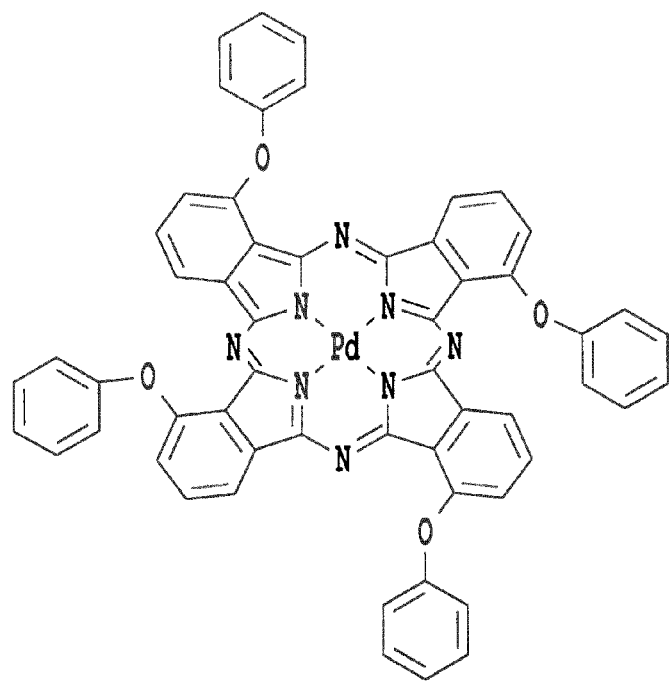

FIGS. 5-7 show various examples of photonic coupling that may be achieved by using devices for modifying, e.g. narrowing the wavelength range in accordance with the present invention. The media according to the present invention may be arranged in multi layer-strictures or in a single layer structure having a specific symmetry and shape that matches the object, for example solar cell, in which spectral narrowing is to be enhanced. The systems shown here may comprise more than one up-conversion pair of sensitizer-emissive component and additionally may also comprise down-converting and/or down-shifting components. The result of all of these is a provision of VIS radiation for further use by the object, e.g. solar cell.

Alternatively, the media in accordance with the present invention may be enclosed within any type of waveguide structures, which are able to support the propagation of the light spectrum, red shifted in comparison with the excitation band of the solar cell. The solar cells are positioned around the outer perimeter of the wave-guided structure, so they can absorb any photon, escaping (i.e. being rejected) from the waveguide. By using a combination of up-converting couples the whole red-shifted spectrum will be up-converted and consistently will be redirected (rejected) towards the solar cell.

The light spectrum blue-shifted in comparison with the excitation band of the solar cell will be spectrally down-shifted and/or down-converted up to the absorption band of the solar cell, and, in embodiments involving a waveguide structure will be also rejected from the wave-guide structure, and consequently absorbed from the solar cell.

Figure 9:
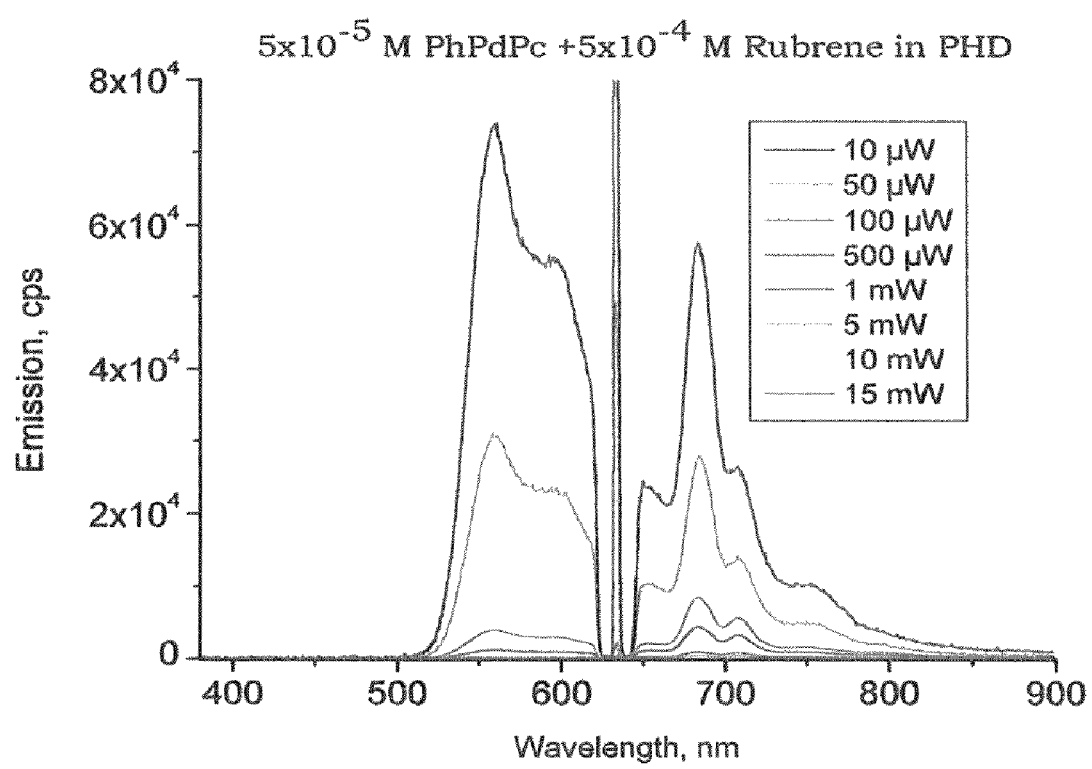
Figure 9:
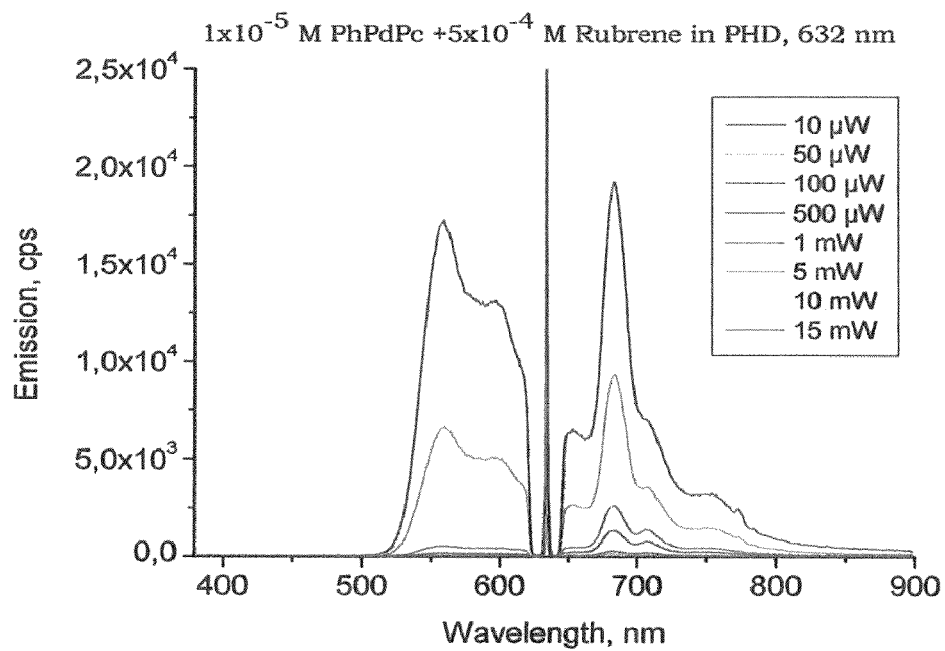
Figure 9:
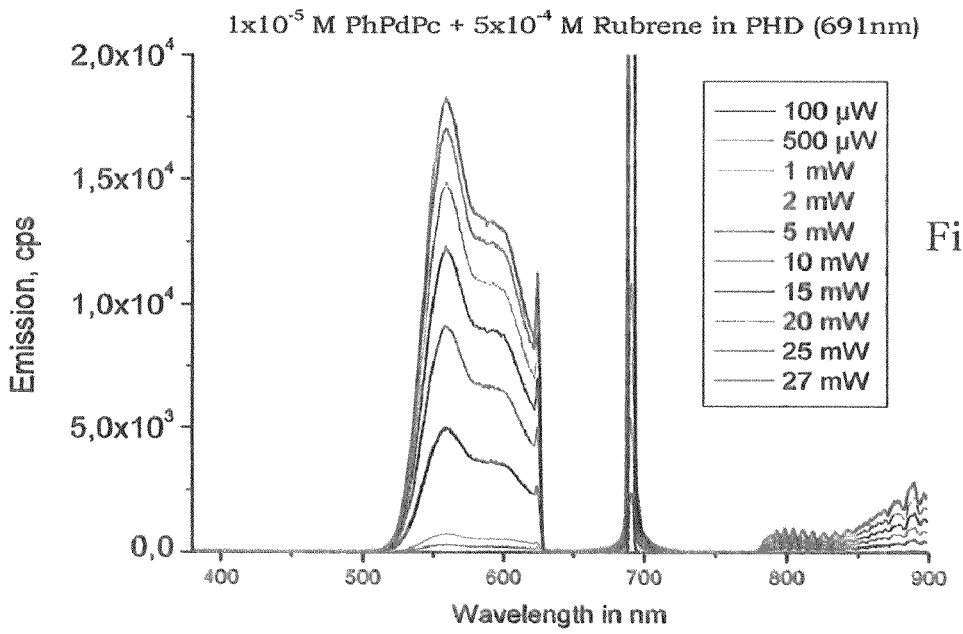
Figure 10:
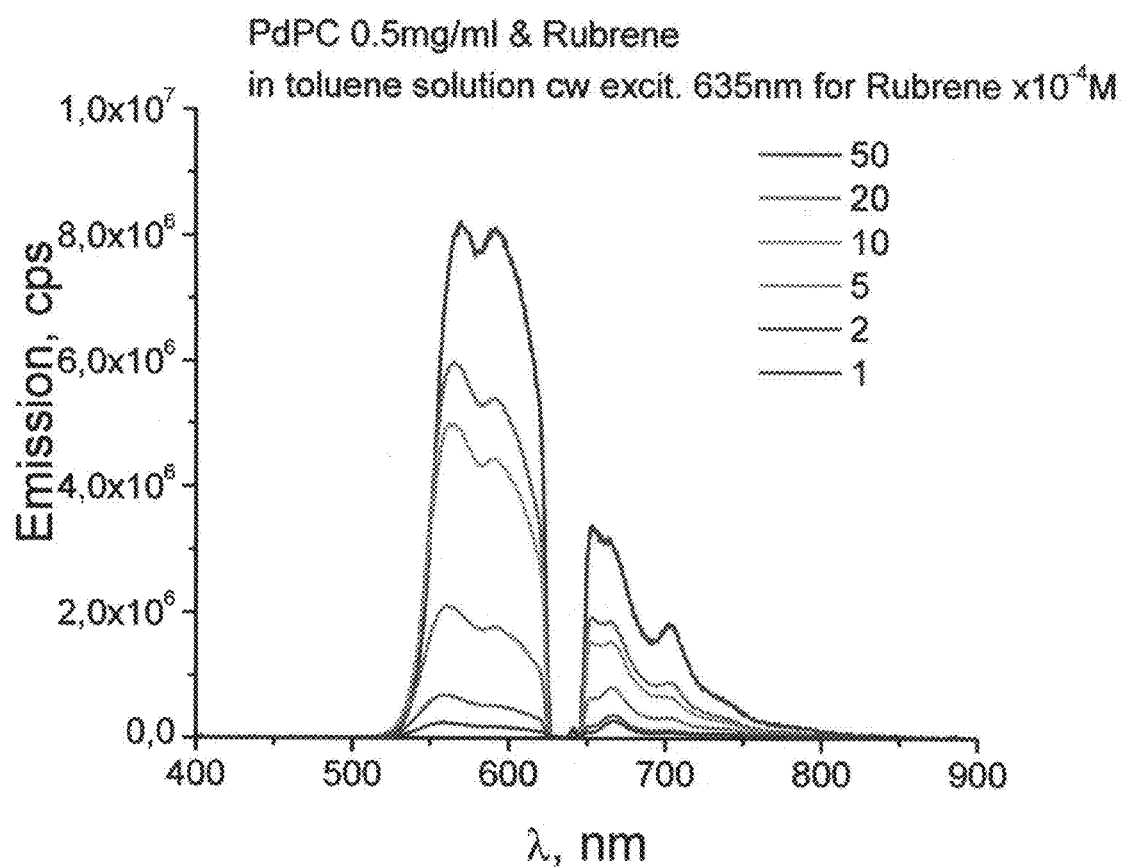
Figure 11A:
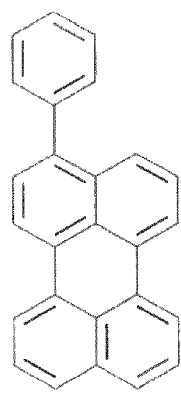
Figure 11B:
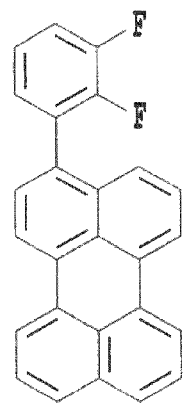
Figure 11C:
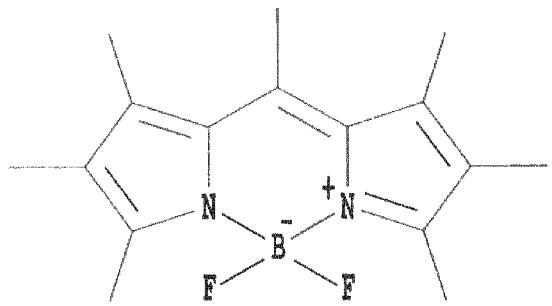
Figure 11D:
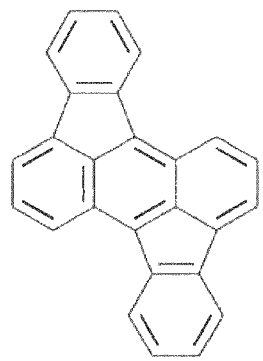
Figure 12:
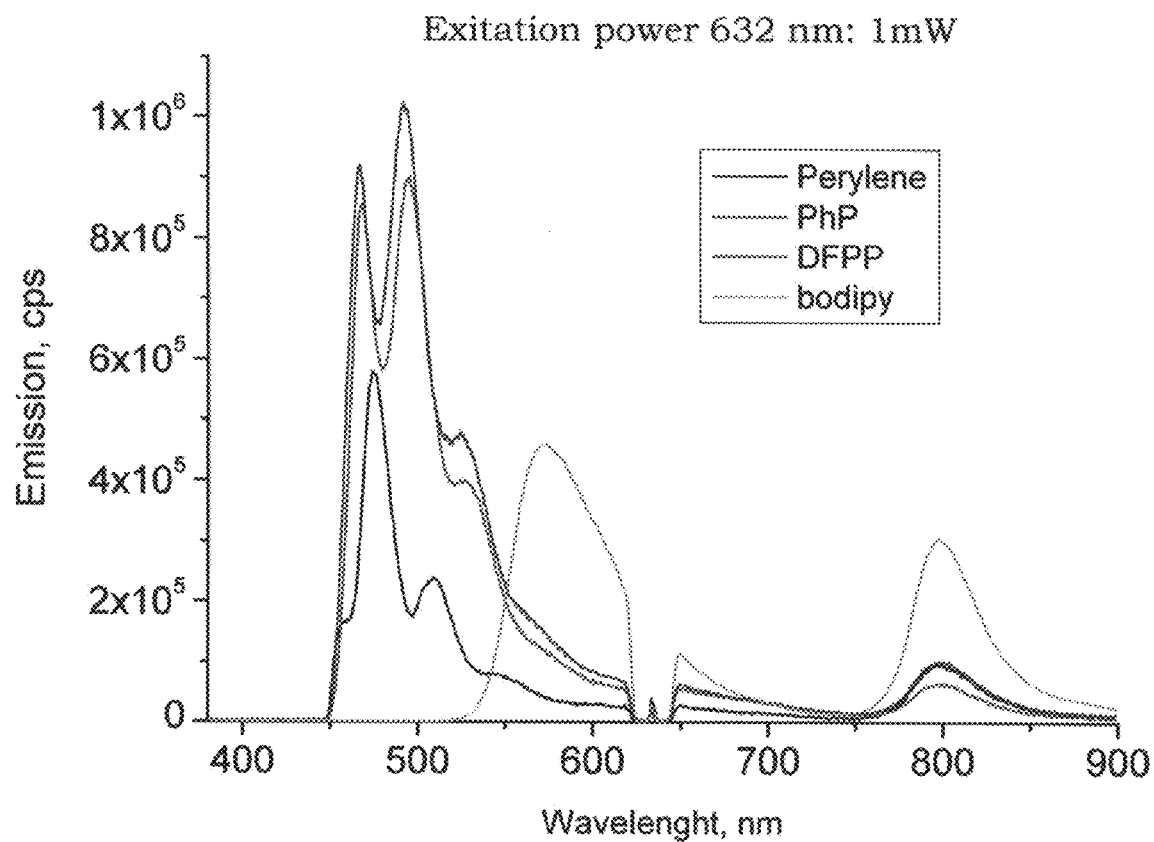
Figure 13:
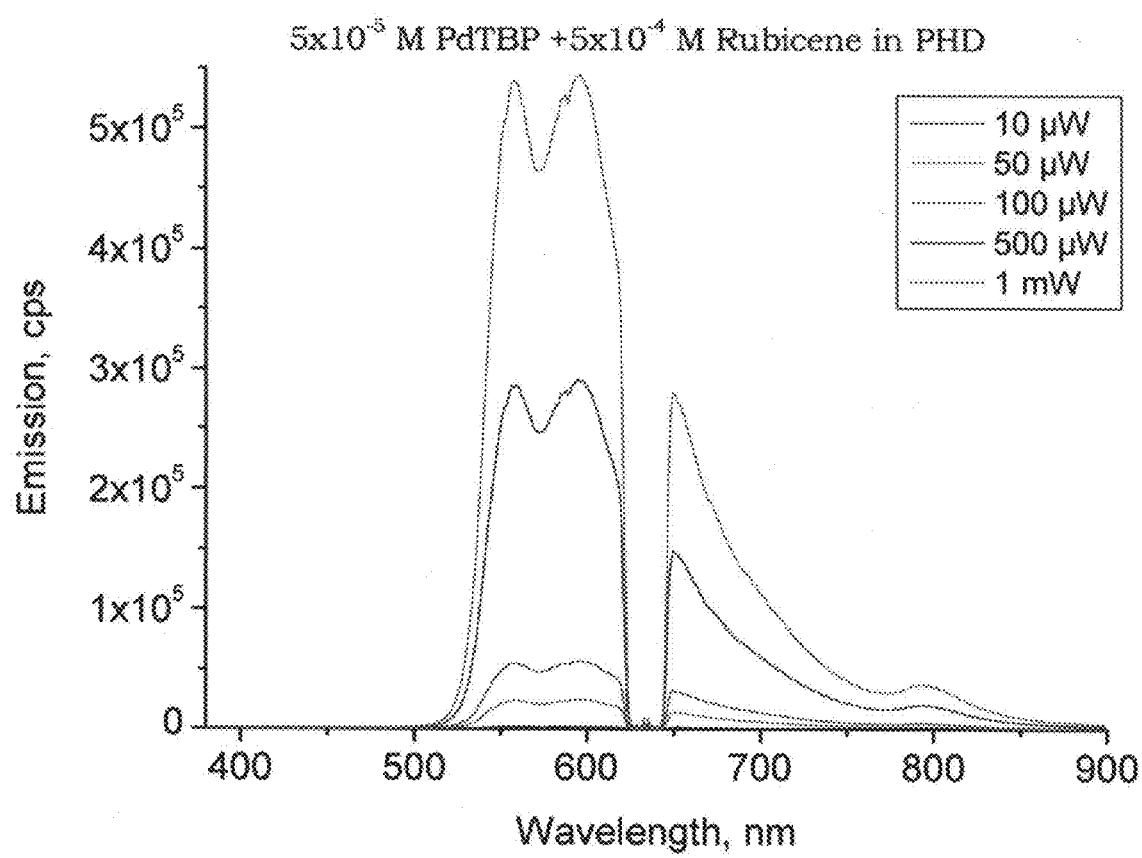
Figure 14:
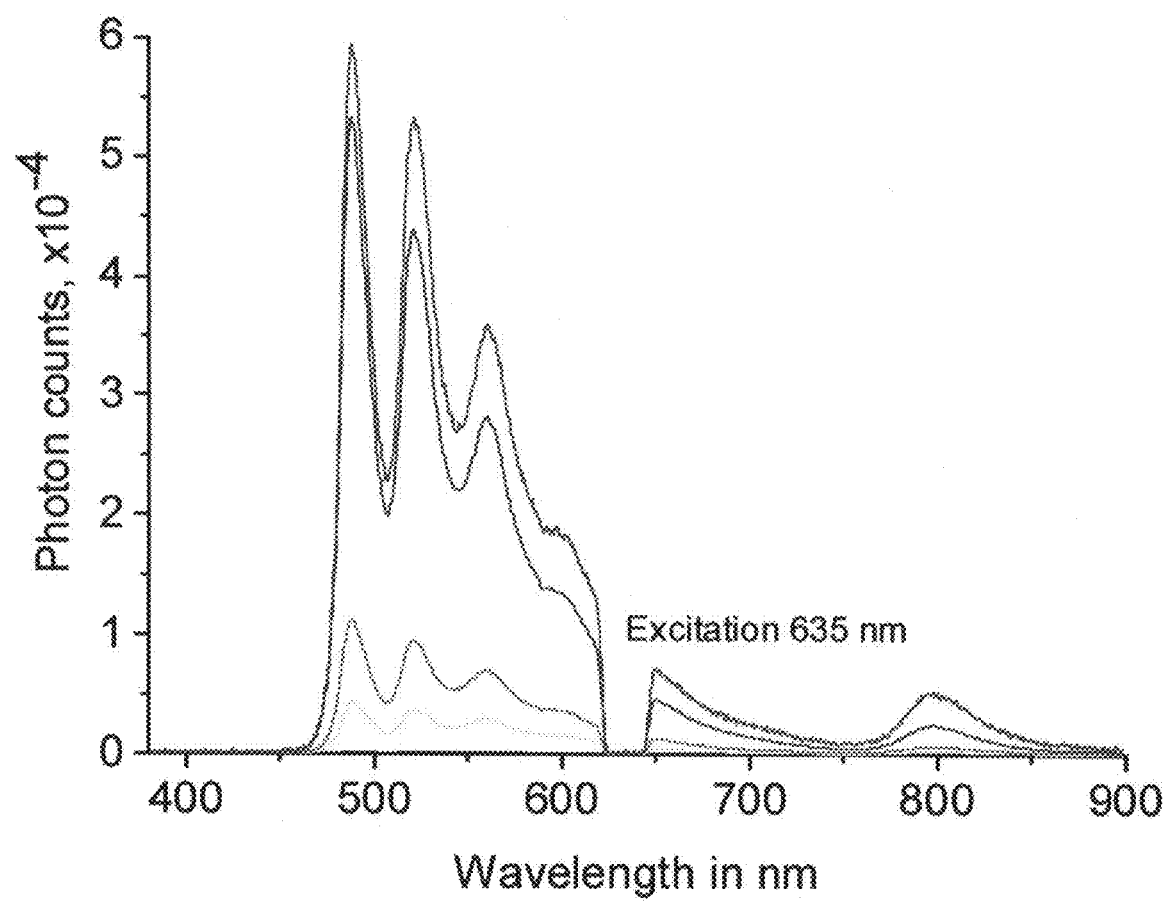
Figure 16A:
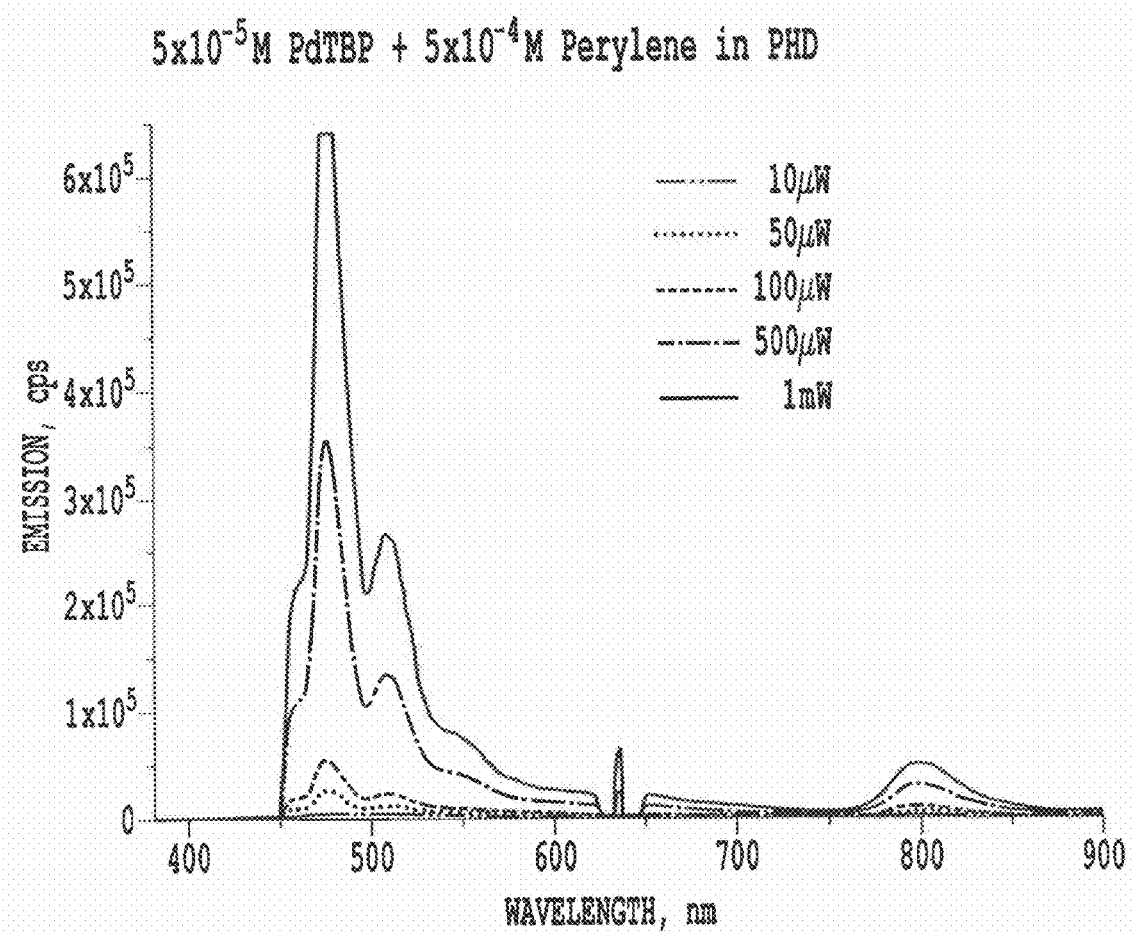
Figure 16B:
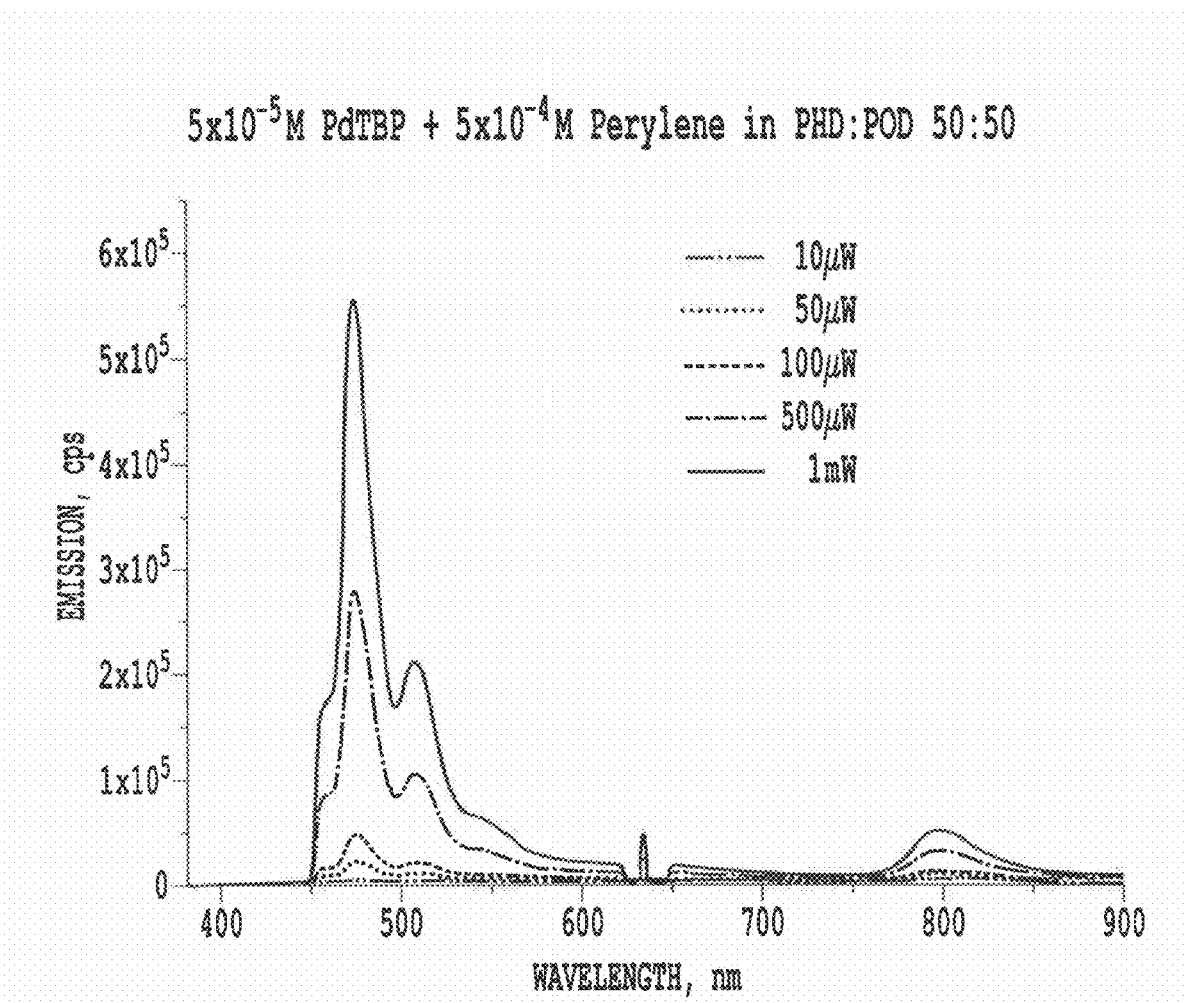
Figure 16C:
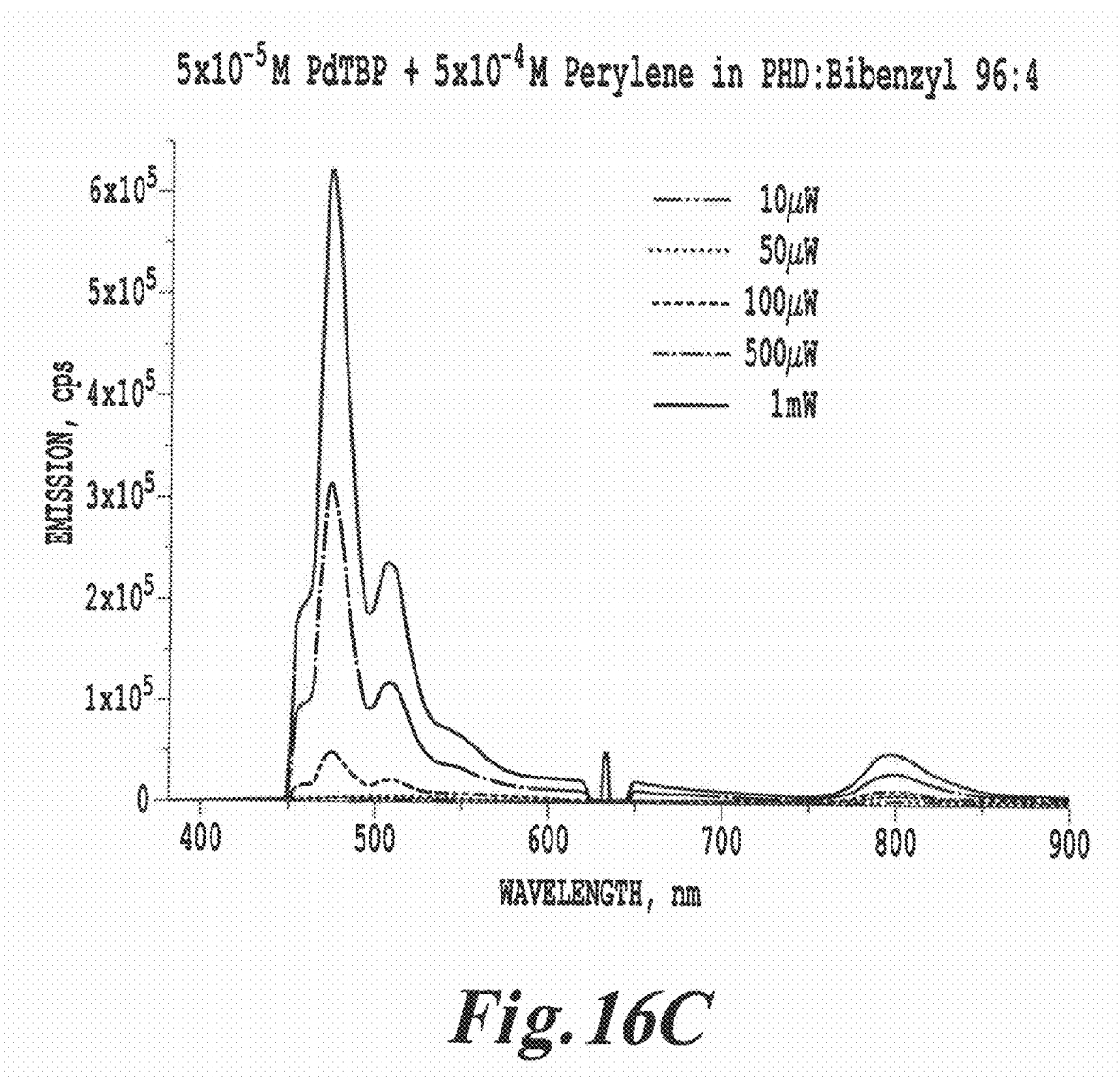
Figure 16D:
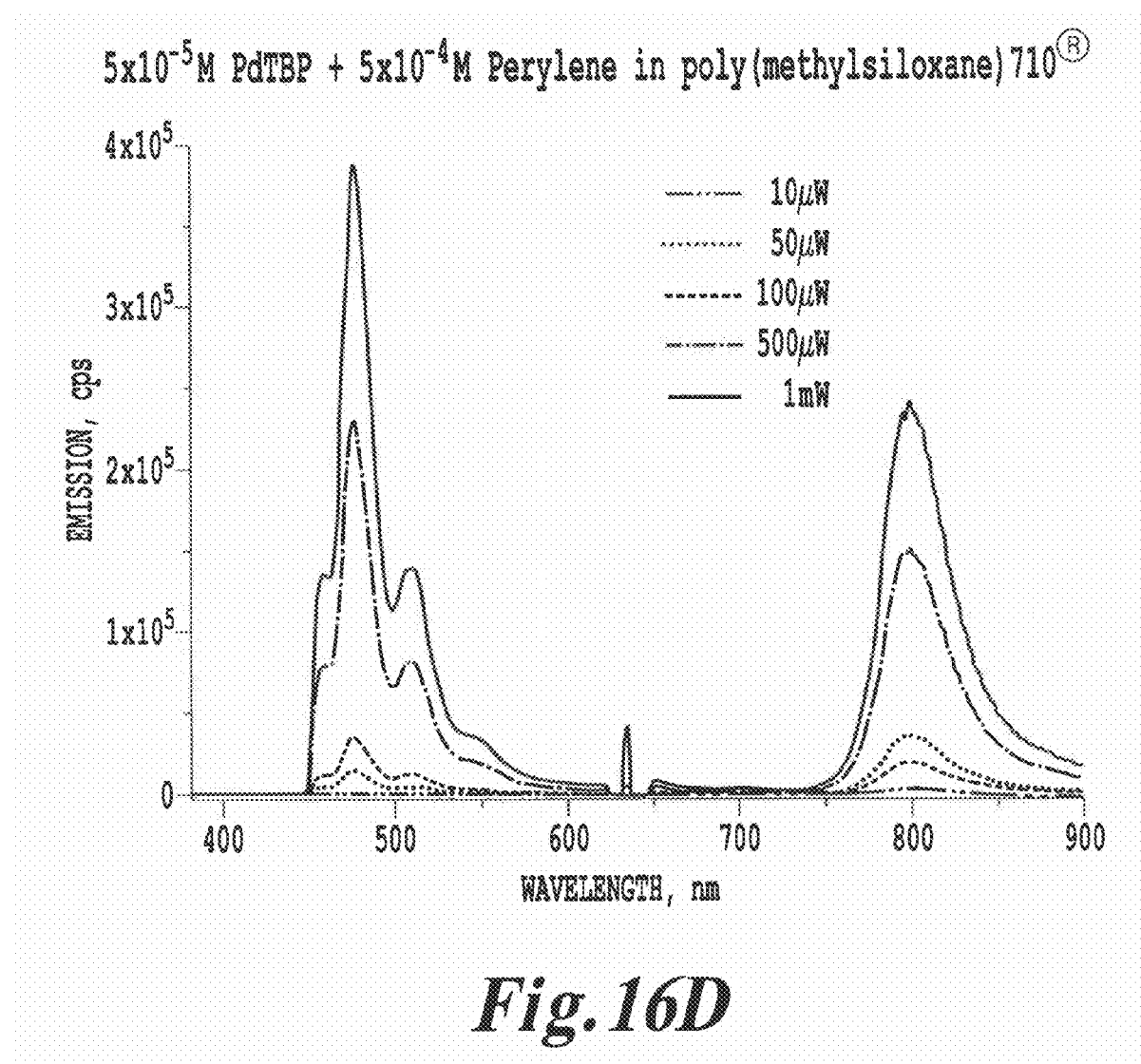
Figure 16E:
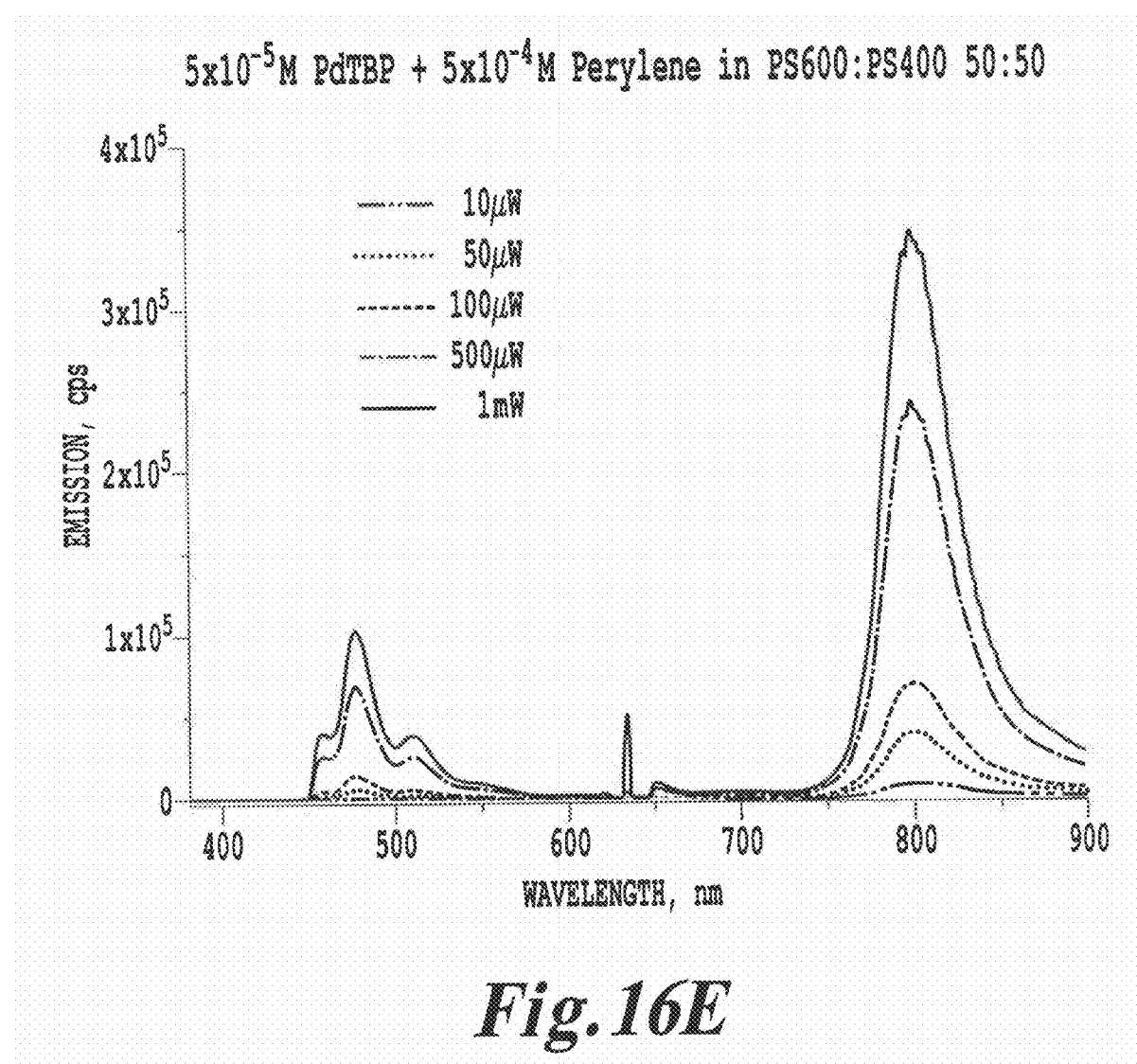
Figure 16F:
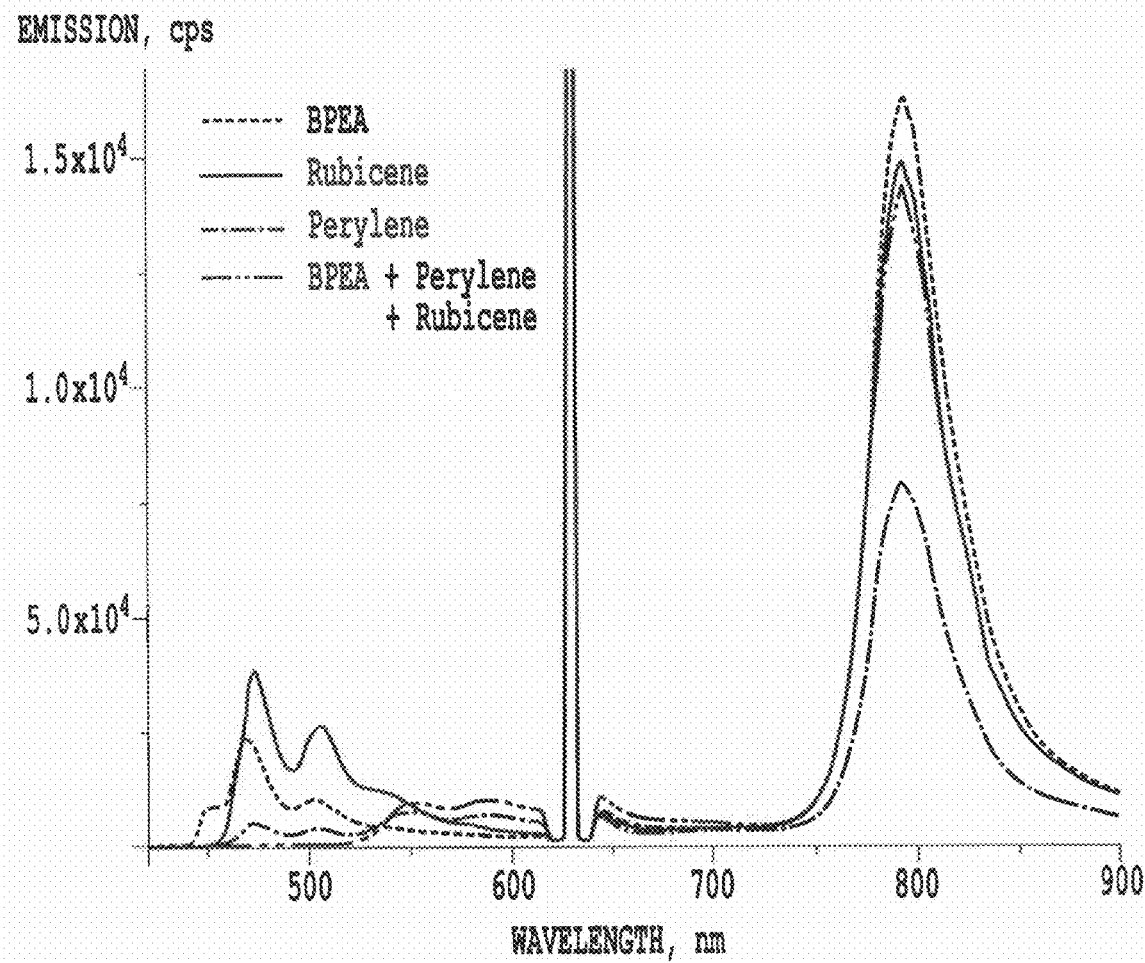

FIG. 8 shows examples of sensitizers, namely
a) Palladium(II) 2,3,9,10,16,17,23,24-Octakis(octyloxy)-phthalocyanine (DOPdPc)
b) Platinum(II) 2,3,9,10,16,17,23,24-Octakis(octyloxy)-phthalocyanine
c) Palladium(II) 2,11,20,29-Tetra-tert-butyl-2,3-naphthalocyanine
d) Palladium(II) 1,8,15,22-Tetraphenoxy-phthalocyanine (PhPdPc);

FIG. 9 shows upconversion spectra of the sensitizer (PhPdPc) with the emitter rubrene with varying sensitizer concentrations in a phenyl-heptadecane (PHD) matrix, namely a) $5\times10^{-5}$ M PhPdPc+$5\times10^{-4}$ M Rubrene
b) $1\times10^{-5}$ M PhPdPc+$5\times10^{-4}$ M Rubrene
   Excitation 635 nm
c) $1\times10^{-5}$ M PhPdPc+$5\times10^{-4}$ M Rubrene with excitation 691 nm;

FIG. 10 shows upconversion spectra of the sensitizer (DOPdPc) with the emitter rubrene with the following concentration in a phenyl-heptadecane (PHD) matrix: $1\times10^{-4}$M PhPdPc+$1\times10^{-3}$M rubrene. The different curves correspond to different intensities of continuous wave excitation at 635 nm (cw at 635 nm);

FIG. 11 shows examples of emitter structures, namely
a) 3-Phenyl-perylene (PhP)
b) 3-(2,3-Difluoro-phenyl)-perylene (DFPP)
c) 2,6-Di-tert-butyl-1,3,5,7,8-penta-methyl-pyrromethene-difluoroborate complex (bodipy)
d) Rubicene;

FIG. 12 shows upconversion spectra of the couples: meso-tetraphenyl-tetrabenzoporphyrin palladium (PdTPTBP) with perylene, PdTPTBP with PhP, and PdTPTBP with DFPP; excitation wavelength 632 nm, 1 mW;

FIG. 13 shows upconversion spectra of the couple: PdTPTBP with rubicene. The excitation wavelength is 632 nm. Different curves correspond to different laser powers as described in the legend;

FIG. 14 shows upconversion spectra of the upconversion system with one sensitizer (PdTPTBP) and three emitters, namely perylene, BPEA (Bis(phenylethynyl)anthracene) and rubicene; with concentrations $5\times10^{-5}$ M PdTPTBP and $1.5\times10^{-4}$ M Rubicene, $1.5\times10^{-4}$ M Perylene and $1.5\times10^{-4}$ M BPEA in matrix PHD; excitation 632 nm, 1 mW.

Figure 18:
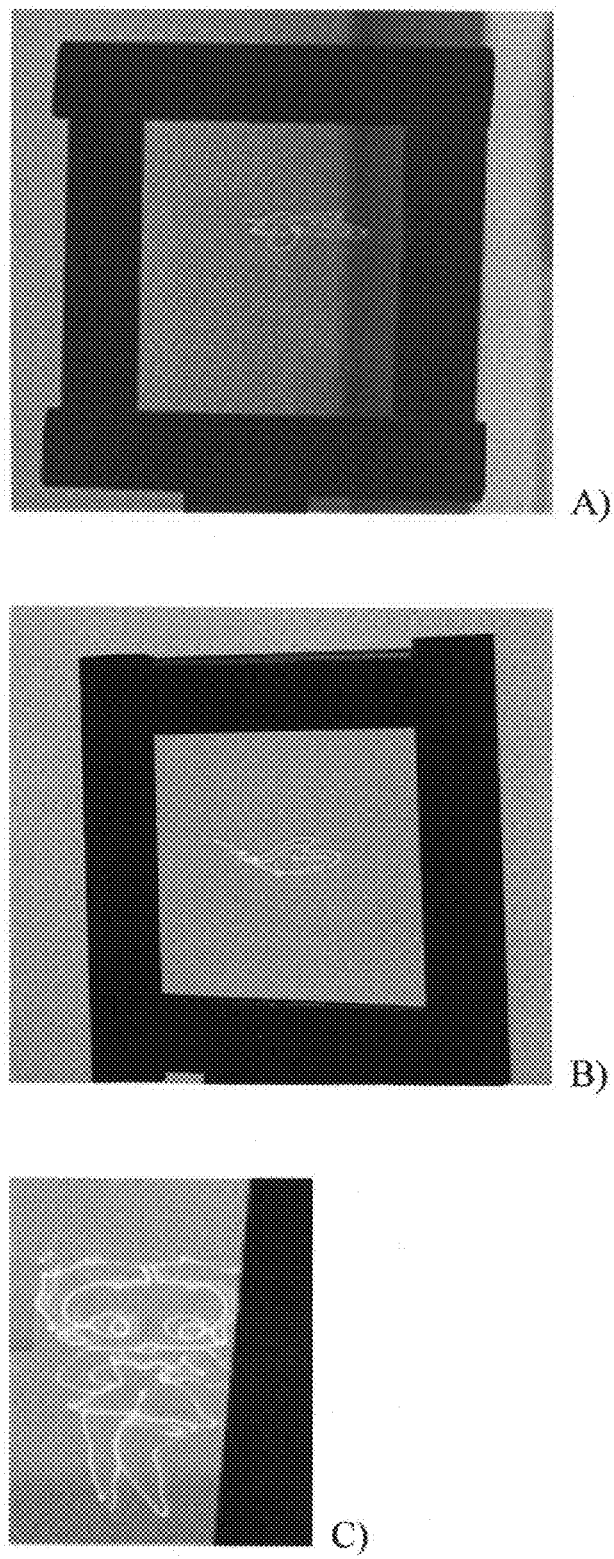
Figure 19:
Figure 19:
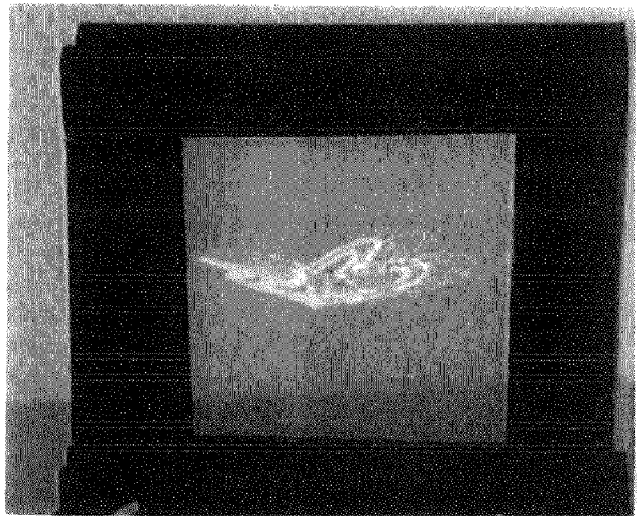
Figure 19:
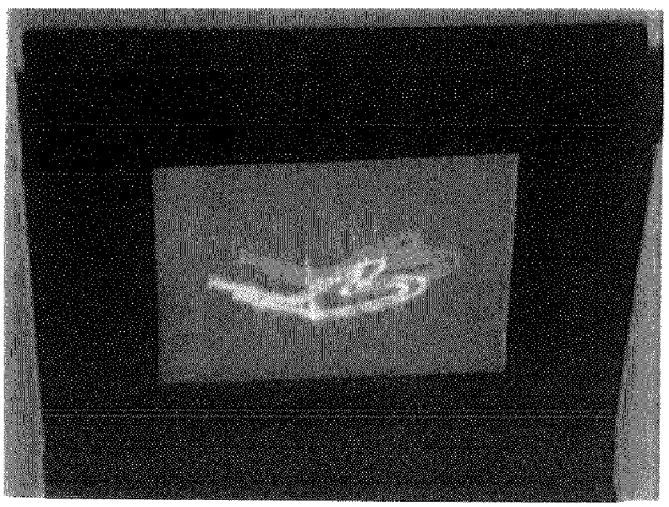

FIG. 15 shows example structures of various matrix molecules, namely
a) 1-phenyl-heptadecane (PHD)—ethylene based oligomer,
b) 1-phenyl-octadecane (POD)—ethylene based oligomer, crystalline, which is added to PHD to control viscosity,
c) Poly(methylphenylsiloxane) 710®—viscosity 450-550 cSt (25° C.),
d) Bibenzyl—crystalline (small molecule)—added to PHD to control viscosity.
e) Oligostyrene (PS400),
f) Polystyrene-b-poly(ethylene/butylene)-b-polystyrene) block copolymer (SEBS);

FIG. 16 shows upconversion spectra of the upconversion system with sensitizer PdTPTBP and the emitter perylene in different matrices. The excitation wave length for all examples was 632 nm:
a) in 1-phenyl-heptadecane (PHD),
b) in a mixture 50:50 PHD:POD,
c) in a mixture 96:4 PHD:Bibenzyl,
d) in poly(methylphenylsiloxane) 710®,
e) in a mixture PS400:PS600 50:50, wherein different curves correspond to different laser power for excitation, as described in the legends,
f) upconversion systems PdTPTBP+BPEA; PdTPTBP+Perylene and PdTPTBP+Rubicene as well as PdTPTBP+BPEA+Perylene+Rubicene in SEBS; laser power 1 mW; Inset: the system PdTPTBP+Perylene excited with non-coherent (LED) source with 150 mWcm$^{-2}$;

FIG. 17 shows an example for spectrum concentration working with non-focussed non-coherent light as directly combined with a dye sensitized solar cell. This is a proof-of-principle that a dye sensitized solar cell (DSSC) works with up-converted emission, non-coherent red LED, 90 mWcm$^{-2}$ and a large area (20×20 mm² upconverter; more specifically, the figure shows a set-up for DSSC characterization using upconverted non-coherent light, wherein FIG. 17a shows a photograph of the set-up; FIG. 17b shows a schematic representation of the set-up with a frontal photograph of the upconverter and the DSSC as irradiated with the 5% of the up-converted light collected; and FIG. 17c shows a spectrum of the LED used in the set-up. The upconverter included the upconversion system with one sensitizer (PdTPTBP) and three emitters, namely perylene, BPEA (Bis(phenylethynyl)anthracene) and rubicene; with concentrations $5\times10^{-5}$ M PdTPTBP and $1.5\times10^{-4}$ M Rubicene, $1.5\times10^{-4}$ M Perylene and $1.5\times10^{-4}$ M BPEA in matrix PHD. The excitation wave length was 633-670 nm with a power of 90 mWcm$^{-2}$ on the upconverter. The upconverter had an active area of 20×20 mm², whereas the area of the DSSC was 10×10 mm²; only 5% of the upconverted photons can be collected in this set-up, such that $J_{sc}$ is only 100 μA/cm². However, it is anticipated that by using wave guide structures, ca. 80% upconverted (UC) photons can be collected;

FIG. 18 shows examples for upconversion displays; two-dimensional displays include transparent displays in different colours, multilayer displays with one excitation source, pixelated displays with one excitation source and multilayer displays with two excitation sources, all of which can be realized in accordance with the present invention; more specifically, FIG. 18 shows transparent displays with different emission colours. The excitation is 635 nm. A) Blue upconversion couple: meso-Tetraphenyl-tetrabenzoporphyrin Palladium (PdTPTBP)+Perylene; B) A green upconversion couple: PdTPTBP+(Bis(phenylethynyl)anthracene) (BPEA); and C) shows a yellow upconversion couple: PdTPTBP+Rubicene;

FIG. 19 shows transparent displays as a demonstration for multilayer displays with different emission colours in the different layers. The excitation wave length is 635 nm.
A) Blue upconversion couple: meso-Tetraphenyl-tetrabenzoporphyrin Palladium (PdTPTBP)+Perylene and Green upconversion couple PdTPTBP+(Bis(phenylethynyl)anthracene) (BPEA);
B) Blue upconversion couple: meso-Tetraphenyl-tetrabenzoporphyrin Palladium (PdTPTBP)+Perylene and yellow upconversion couple: PdTPTBP+Rubicene;
C) Yellow upconversion couple: PdTPTBP+Rubicene and Green upconversion couple PdTPTBP+(Bis(phenylethynyl)anthracene) (BPEA)
D) Blue upconversion couple: meso-Tetraphenyl-tetrabenzoporphyrin Palladium (PdTPTBP)+Perylene and Green upconversion couple PdTPTBP+(Bis(phenylethynyl)anthracene) (BPEA) and Yellow upconversion couple: PdTPTBP+Rubicene. The displays shown are highly transparent single colour displays, which can be placed with a distance in between. This may generate a three-dimensional effect whilst keeping the transparency at the same time. More than five layers are in principle possible.

Figure 20:
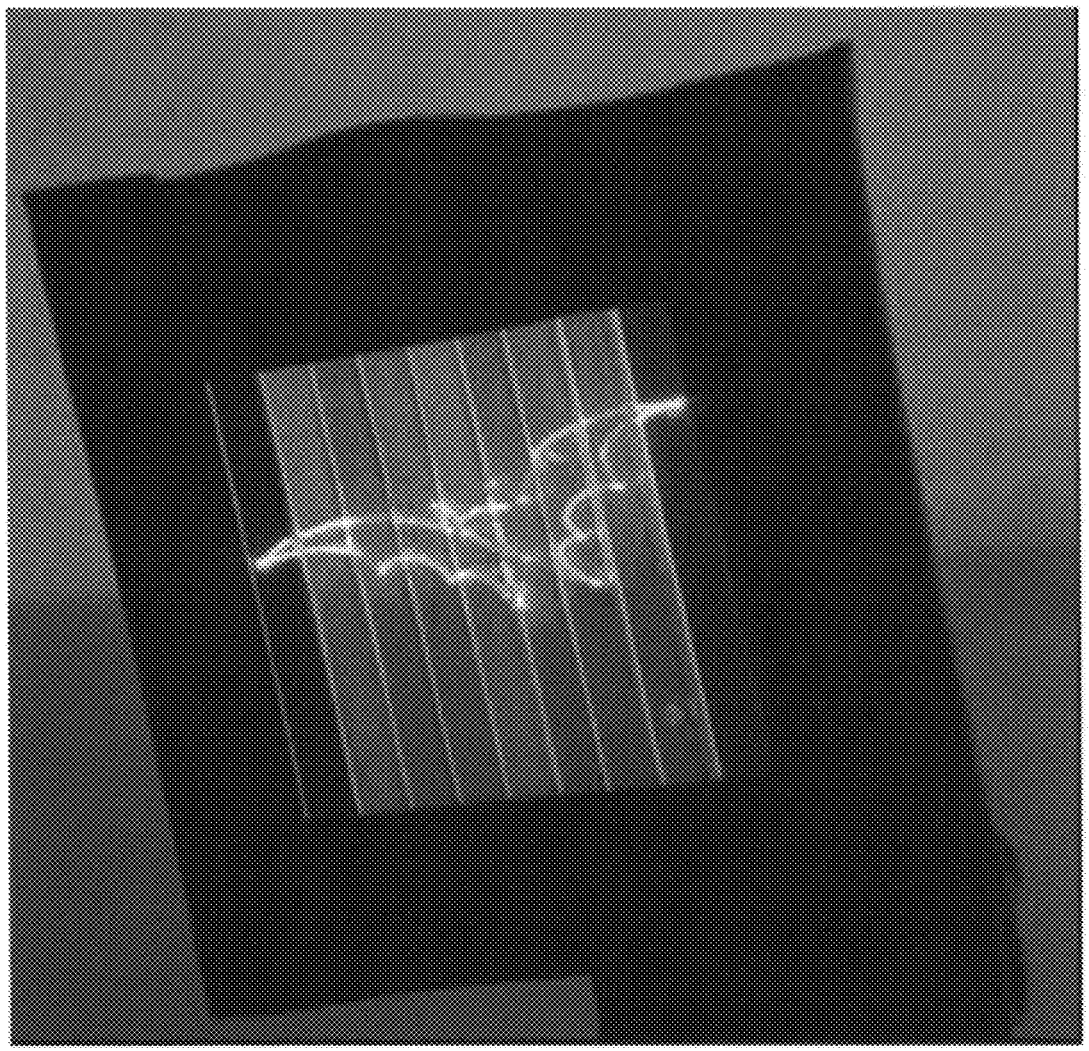

FIG. 20 shows the first prototype of a pixelated display. The excitation in this example is 635 nm. The blue up-conversion couple is meso-Tetraphenyl-tetrabenzoporphyrin Palladium (PdTPTBP)+Perylene; the green upconversion couple is PdTPTBP+(Bis(phenylethynyl)anthracene) (BPEA);
One yellow upconversion couple is PdTPTBP+Rubicene, and another yellow upconversion couple is PdTPTBP+Rubrene.

FIG. 21 shows examples for three-dimensional displays. As a proof of principle, a point/pixel of upconverted emission, i.e. an emissive pixel is created in a three-dimensional medium for upconversion. FIG. 21a shows the system $5\times10^{-5}$M PdTPTBP+$5\times10^{-4}$M BPEA in PHD; the excitation beam having 6 mm in diameter is focused with a numerical aperture (NA) of 0.25 in a spot with a length of ca. 1100 µm and a height of ca. 200 µm. The excitation wave length was 685 nm with a power of 1.3 mW.

FIG. 21b shows 2.5×10−5 M PdTPTBP+5×10−4 M BPEA in PHD. The excitation beam was 10 mm in diameter focused with a numerical aperture of 0.1 in a spot with a length of ca. 1000 µm and height of ca. 500 µm. The excitation wavelength was 685 nm, and the power was 15 mW. This is a proof-of-principle that also three-dimensional displays using the medium in accordance with the present invention are possible.

In using the devices according to the present invention, an efficiency of 5% or more within solar cells may be achieved. Moreover, in using the devices according to the present invention it is possible to use non-coherent excitation light, such as sun-light and even a very low excitation intensity, such as in the mWcm$^{-2}$ range. Furthermore, it is possible to tune the excitation light down to the infrared region. Because the systems in accordance with the present invention can be practically made into any shape, they are particularly suited for solar cells or as windows or in combination with windows.

The features of the present invention disclosed in the specification, the claims and/or in the accompanying drawings, may, both separately, and in any combination thereof, be material for realizing the invention in various forms thereof.

The invention claimed is:

1. A device for modifying a wavelength range of a spectrum of light incident on said device, such that light emitted from said device has a modified wavelength range in comparison to said incident light, said device comprising:
a medium that provides photon energy up-conversion including at least two components and a matrix in which said at least two components are distributed,
wherein a first component absorbs light at a first wavelength region $w \leq \lambda_1 \leq x$, said first component functions as a sensitizer in said medium, and a second component emits light at a second wavelength region $y \leq \lambda_2 \leq z$, said second component functions as an emissive component in said medium, $\lambda_2 \leq \lambda_1$, upon absorption of light by said first component at said first wavelength region $\lambda_1$, said emissive component emits light at said second wavelength region $\lambda_2$, said first component and said second component are organic compounds, and said first component and said second component are distributed in said matrix which is a solid, a gel or a fluid with viscosity equal or higher than $0.59 \times 10^{-3}$ Pa·s.

2. The device according to claim 1, wherein said medium comprises at least two pairs of sensitizer and emissive components, each pair having a defined absorption wavelength region and a defined emission wavelength region, and said pairs of sensitizer and emissive components, respectively, differ from each other in at least their respective absorption wavelength region.

3. The device according to claim 1, wherein said medium additionally comprises a further component that provides photon energy down-shifting or photon energy down-conversion, said down-shifting or down-conversion component is distributed within said matrix, said down-shifting or down-conversion component absorbs light of a defined wavelength region and emits light at a wavelength region longer than said defined wavelength region.

4. The device according to claim 1, wherein said medium is arranged in a single layer, waveguide, or shape suitable to cover at least part of a surface of an object upon which said light is incident.

5. The device according to claim 4, wherein said single layer, waveguide, or shape has cylindrical, paralleliped, or triclinic symmetry.

6. The device according to claim 4, wherein the object is a solar cell.

7. The device according to claim 1, wherein said medium is arranged in several layers, some layers having a different pair of sensitizer and emissive components in it.

8. The device according to claim 7, wherein one layer of said several layers comprises a component that provides photon energy down-shifting or down-conversion, said down-shifting or down-conversion component is distributed within said matrix, said down-shifting or down-conversion component absorbs light of a defined wavelength region and emits light at a wavelength region longer than said defined wavelength region.

9. The device according to claim 8, wherein said layer that comprises said down-shifting or down-conversion component is devoid of any pair of sensitizer and emissive component.

10. The device according to claim 8, wherein said down-shifting or down-conversion component absorbs light in a UV-wavelength region and emits light in a blue wavelength region.

11. The device according to claim 1, wherein said medium comprises one pair of sensitizer and emissive component which absorbs light in the green wavelength region and emits light in the blue wavelength region, and said medium comprises another pair of sensitizer and emissive component which absorbs light in the red wavelength region and emits light in the blue wavelength region.

12. The device according to claim 1, wherein said medium comprises one pair of sensitizer and emissive component which is perylene and palladium octaethylporphyrine (PdOEP), and another pair of sensitizer and emissive component which is perylene and platinum octaethylporphyrine (PtOEP).

13. The device according to claim 3, wherein said medium comprises perylene as a component for the photon energy down-conversion.

14. The device according to claim 1, wherein said matrix is transparent with respect to electromagnetic radiation in a wavelength range from 300 to 1600 nm.

15. The device according to claim 1, wherein said matrix is said fluid, and said fluid has a viscosity in a range of from $0.59 \times 10^{-3}$ to $1 \times 10^6$ Pa·s.

16. The device according to claim 1, wherein said matrix is the solid with elastic, plastic, viscoelastic or viscoplastic properties.

17. The device according to claim 1, wherein said matrix is an organic or inorganic glass with a viscosity in a range of from $1 \times 10^3$ to $1 \times 10^{17}$ Pa·s.

18. The device according to claim 1, wherein said matrix is a viscous liquid having a viscosity $\geq 0.59 \times 10^{-3}$ Pa·s.

19. The device according to claim 18, wherein said matrix is made of one or several materials selected from the following, organic oligomers, said oligomers having a finite number of monomeric units, and co-oligomers, said co-oligomers including a mixture of monomeric units, said momomeric units including a class of substituted or non-substituted styrenes, phenylenes, phenylene diamines, phenylene diols, methyl methacrylates, phenols, acrylic acids, vinyls, lactic acids, carbohydrates, carbonates, imides, amides, olefins, olefin oxides, olefin glycols, terephthalic acids, epsilon-caprolactams, urethanes, silanes, siloxanes and substituted and functionalised forms of any of the foregoing, and any combination thereof.

20. The device according to claim 18, wherein said matrix includes one or several organic solvents or water to vary, adjust and control the viscosity.

21. The device according to claim 1, wherein said matrix is an inorganic or organic gel having a viscosity $\geq 1 \times 10^{-1}$ Pa·s.

22. The device according to claim 21, wherein said matrix is said organic gel, and said organic gel is an organic physical gel having non-covalent bonds or is a chemical gel having covalent bonds.

23. The device according to claim 22, wherein said organic gel is a chemical gel having covalent bonds crosslinked.

24. The device according to claim 21, wherein said gel contains one or several linear and branched polymers, including poly(styrenes), (poly)phenylenes, poly(naphthalate), poly(terephthalate), poly(olefin-naphthalate) and poly(olefin-terephthalate), poly(ethylene terephthale), poly(ether imides), poly(ether ketones), poly(hydroxyl-butyrates), poly(phenylene diamines), poly(phenylene diols), poly(methyl methacrylates), poly(phenols), poly(acrylic acids), poly(vinyls), poly(lactic acids), poly(carbohydrates), poly(carbonate), poly(imide), poly(amide), poly(olefin oxides), poly(olefin glycols), poly(terephthalic acids), poly(epsilon-caprolactam), poly(urethanes), polysilanes, poly(siloxanes) and combinations, mixtures or blends of any of the foregoing.

25. The device according to claim 1, wherein said matrix is a solid or glass having a viscosity $\geq 1 \times 10^3$ Pa·s.

26. The device according to claim 25, wherein said matrix is made of a thermoplastic polymer or copolymer, or a mixture thereof.

27. The medium according to claim 25, wherein said matrix is made of polymer or copolymer, including poly(styrenes), (poly)phenylenes, poly(naphthalate), poly(terephthalate), poly(olefin-naphthalate), poly(olefin-terephthalate), poly(ethylene terephthale), poly(ether imides), poly(ether ketones), poly(hydroxyl-butyrates), poly(phenylene diamines), poly(phenylene diols), poly(methyl methacrylates), poly(phenols), poly(acrylic acids), poly(vinyls), poly(lactic acids), poly(carbohydrates), poly(carbonate), poly(imide), poly(amide), olefins, poly(olefin oxides), poly(olefin glycols), poly(terephthalic acids), poly(epsilon-caprolactam), poly(urethanes), poly(silanes), poly(siloxanes) and combinations, mixtures or blends of any of the foregoing.

28. The device according to claim 25, wherein said matrix is made of a thermosetting plastic.

29. The device according to claim 28, wherein said thermosetting plastic is one of polyester resins, epoxy resins, acrylics, polyimides, melamine resins, and phenol-formaldehyde resins.

30. The device according to claim 1, wherein said matrix is made of an elastic solid.

31. The device according to claim 30, wherein said elastic solid is a polymer elastomer that includes polyacrylic rubbers, silicone rubbers, fluorosilicone rubbers, fluoroelastomers, perfluoroelastomers, polyether-block-amides, or olefin rubbers.

32. The device according to claim 1, wherein said matrix does not take part in a photon energy up-conversion process upon irradiation of said medium.

33. The device according to claim 1, wherein said first component is a first organic compound and said second component is a second organic compound.

34. The device according to claim 33, wherein said first and said second organic compounds are different compounds.

35. The device according to claim 34, wherein said first and said second organic compound is a carbon-containing compound that is not a hydrogen-free chalcogenide of carbon, a derivative thereof, a salt-like carbide, a metallic carbide or a metal-carbonyl.

36. The device according to claim 33, wherein said first and said second organic compound is a carbon-containing compound, that is not a hydrogen-free chalcogenide of carbon, a derivative thereof, a salt-like carbide, a metallic carbide or a metal-carbonyl.

37. The device according to claim 1, wherein said first component is neither covalently bonded nor complexed to said second component.

38. The device according to claim 37, wherein said first and said second organic compounds are different compounds.

39. The device according to claim 37, wherein said first and said second organic compound is a carbon-containing compound that is not a hydrogen-free chalcogenide of carbon, a derivative thereof, a salt-like carbide, a metallic carbide or a metal-carbonyl.

40. The device according to claim 1, wherein said first component is covalently bonded or complexed to said second component.

41. The device according to claim 40, wherein said first and said second organic compounds are different compounds.

42. The device according to claim 40, wherein said first and said second organic compound is a carbon-containing compound that is not a hydrogen-free chalcogenide of carbon, a derivative thereof, a salt-like carbide, a metallic carbide or a metal-carbonyl.

43. The device according to claim 1, wherein said emissive component's emission of light at said second wavelength region $\lambda_2$ is due to an up-conversion process based on direct or sequential two-photon excitation or on direct or sequential multi-photon excitation or on excitation of molecules populating high vibrational state(s), which up-conversion process occurs upon absorption of light by said first component at said first wavelength region $\lambda_1$.

44. The device according to claim 1, wherein said emissive component's emission of light at said second wavelength region $\lambda_2$ is due to an up-conversion process based at least one of a triplet-triplet annihilation process between photoexcited molecules of said emissive component and a triplet-triplet annihilation process between photo-excited molecules of said first component.

45. The device according to claim 1, wherein said second wavelength region $\lambda_2$ is in the range 360-750 nm and said first wavelength region $\lambda_1$ is in the range 450-1600 nm.

46. The device according to claim 1, wherein said first component is an organic dye or molecule having a populated triplet or mixed triplet-singlet state, a two-photon-absorbing (TPA)-dye, an optical limiting compound, another molecule with a populated triplet state or an optical limiting compound.

47. The device according to claim 1, wherein said second component is an organic dye.

48. The device according to claim 1, wherein said first component is a first organic dye and said second component is a second organic dye, wherein said first and second organic dyes are the same.

49. The device according to claim 48, wherein at least one of said first and said second organic is dyes include one of organic dyes with populated triplet states or capable of direct and/or sequential two-photon excitation, organic dyes capable of direct and/or multi-photon excitation, organic dyes capable of non-linear absorption, and organic dyes capable of hot-band absorption.

50. The device according to claim 1, wherein said first component is a first organic dye and said second component is a second organic dye, said first organic dye includes organic molecules having populated triplet states.

51. The device according to claim 50, wherein said first organic dye includes at least one of, porphyrins, phthalocyanines, and benzopyridines, benzopyrizines, quinolates and hydroxyquinolates, acetyl-acetonates, substituted benzopyridines, benzopyrizines, quinolates and hydroxyquinolates, acetyl-acetonates; and said second organic dye includes compounds showing fluorescence emission in a range of from 360 to 750 nm.

52. The device according to claim 50, wherein said first organic dye is at an energy level allowing a triplet-triplet annihilation process and a subsequent transfer of energy to an excited singlet state of said second organic dye.

53. The device according to claim 1, wherein combinations of said first and second components are selected from:
  a) Green couple: DPA/PdOEP;
  b) Red couple: BPEA/PdTPTBP;
  c) Near infra red couple: BPEN/PdTPTNP;
  d) Direct Red-to-Blue couple: Perylene/PdTPTBP;
  e) Direct Infrared-to-Green couple: BPBT/PdTPTNP;
  f) Infrared-to-yellow couple: Rubrene/PdTAP.

54. The device according to claim 1, wherein said first and said second components are homogeneously distributed within said matrix.

55. The device according to claim 1, wherein said first and said second components are encapsulated in particles having average dimensions in a range of from 5 nm to 999 μm, and such particles are homogeneously distributed within said matrix.

56. The device according to claim 55, wherein said particles have average dimensions in a range of from 10 nm to 999 μm.

57. The device according to claim 55, wherein said particles have a surface which is functionalized by functional groups to allow distribution of said particles within said matrix.

58. The device according to claim 1, wherein said medium comprises further pairs of sensitizer and emissive components with different absorption and emission wavelength regions than the first component and the second component.

59. The device according to claim 1, further comprising:
a light transparent container that contains said medium.

60. The device according to claim 1, further comprising:
a light transparent substrate that carries said medium.

61. The device according to claim 1, wherein said first component includes a fullerene or carbon nanotubes.

62. The device according to claim 1, wherein said first component is a first organic dye and said second component is a second organic dye, wherein said first and second organic dyes are different.

63. A method comprising:
obtaining a device for modifying a wavelength range of a spectrum of light incident on said device, such that light emitted from said device onto an object has a modified wavelength range in comparison to said incident light, said device including a medium that provides photon energy up-conversion including at least two components and a matrix in which said at least two components are distributed, wherein a first component absorbs light at a first wavelength region $w \leq \lambda 1 \leq x$, said first component functions as a sensitizer in said medium, and a second component emits light at a second wavelength region $y \leq \lambda 2 \leq z$, said second component functions as an emissive component in said medium, $\lambda 2 \leq \lambda 1$, upon absorption of light by said first component at said first wavelength region $\lambda 1$, said emissive component emits light at said second wavelength region $\lambda 2$, said first component and said second component are organic compounds, and said first component and said second component are distributed in said matrix which is a solid, a gel or a fluid with viscosity equal or higher than $0.59 \times 10^{-3}$ Pa·s; and
arranging said device in a spatial relation to said object such that radiation irradiated upon said object passes through said device before impinging on said object.

64. The method according to claim 63, wherein said step of arranging includes contacting said device with said object, or using said device as cover of said object.

* * * * *